United States Patent
Lekas et al.

(10) Patent No.: US 12,531,181 B2
(45) Date of Patent: Jan. 20, 2026

(54) MULTI-LAYERED METAL FRAME POWER PACKAGE

(71) Applicant: Ferric Inc., New York, NY (US)

(72) Inventors: Michael Lekas, Brooklyn, NY (US); Noah Sturcken, New York, NY (US)

(73) Assignee: Ferric Inc., New York, NY (US)

( * ) Notice: Subject to any disclaimer, the term of this patent is extended or adjusted under 35 U.S.C. 154(b) by 528 days.

(21) Appl. No.: 18/150,517

(22) Filed: Jan. 5, 2023

(65) Prior Publication Data

US 2023/0215615 A1     Jul. 6, 2023

Related U.S. Application Data

(60) Provisional application No. 63/266,473, filed on Jan. 6, 2022.

(51) Int. Cl.
*H01F 27/28*     (2006.01)
*H01F 27/245*     (2006.01)
(Continued)

(52) U.S. Cl.
CPC ....... *H01F 27/2847* (2013.01); *H01F 27/266* (2013.01); *H01F 27/324* (2013.01);
(Continued)

(58) Field of Classification Search
CPC .. H01F 27/2847; H01F 27/266; H01F 27/324; H01F 27/245; H01F 27/343;
(Continued)

(56) References Cited

U.S. PATENT DOCUMENTS

| | | |
|---|---|---|
| 9,647,053 B2 | 5/2017 | Sturcken et al. |
| 10,354,950 B2 | 7/2019 | Sturcken et al. |

(Continued)

FOREIGN PATENT DOCUMENTS

| | | |
|---|---|---|
| TW | 200834860 A | 8/2008 |
| TW | I496262 B | 8/2015 |
| TW | 202201663 A | 1/2022 |

OTHER PUBLICATIONS

Office Action for TW Patent App. No. 112100597, dated Oct. 16, 2024.

(Continued)

*Primary Examiner* — Caleen O Sullivan
(74) *Attorney, Agent, or Firm* — Intrinsic Law Corp.

(57) ABSTRACT

An electronics assembly includes a plurality of planar conductive metal sheets including a first conductive metal sheet, a second conductive metal sheet attached and electrically coupled to the first metal sheet, and a third conductive metal sheet attached and electrically coupled to the second metal sheet. The second metal sheet is located between the first and third conductive metal sheets. Air gaps are defined in the plurality of planar conductive metal sheets to form metal traces that define electrically isolated conductive paths from an outer surface of the first conductive metal sheet to an outer surface of the third conductive metal sheet in a multilevel conductive wiring network. The multilevel conductive wiring network can be attached and electrically coupled to a microchip and to one or more capacitors to form a power converter.

58 Claims, 12 Drawing Sheets

(51) Int. Cl.

| | |
|---|---|
| H01F 27/26 | (2006.01) |
| H01F 27/32 | (2006.01) |
| H01F 27/34 | (2006.01) |
| H01L 21/48 | (2006.01) |
| H01L 23/00 | (2006.01) |
| H01L 23/495 | (2006.01) |
| H01L 23/52 | (2006.01) |
| H01L 25/16 | (2023.01) |
| H02M 3/00 | (2006.01) |

(52) U.S. Cl.
CPC .... *H01L 21/4828* (2013.01); *H01L 23/49534* (2013.01); *H01L 23/49548* (2013.01); *H01L 23/52* (2013.01); *H01L 25/16* (2013.01); *H02M 3/003* (2021.05); *H01F 27/245* (2013.01); *H01F 27/343* (2013.01); *H01L 24/05* (2013.01); *H01L 24/06* (2013.01); *H01L 24/13* (2013.01); *H01L 24/14* (2013.01); *H01L 24/16* (2013.01); *H01L 2224/05624* (2013.01); *H01L 2224/05644* (2013.01); *H01L 2224/05655* (2013.01); *H01L 2224/05664* (2013.01); *H01L 2224/0603* (2013.01); *H01L 2224/13111* (2013.01); *H01L 2224/13144* (2013.01); *H01L 2224/13147* (2013.01); *H01L 2224/13155* (2013.01); *H01L 2224/1403* (2013.01); *H01L 2224/16145* (2013.01); *H01L 2224/16265* (2013.01); *H01L 2924/014* (2013.01); *H01L 2924/1205* (2013.01); *H01L 2924/19011* (2013.01); *H01L 2924/19042* (2013.01); *H01L 2924/1905* (2013.01)

(58) Field of Classification Search
CPC ........... H01L 21/4828; H01L 23/49534; H01L 23/49548; H01L 23/52; H01L 25/16; H01L 24/05; H01L 24/06; H01L 24/13; H01L 24/14; H01L 24/16; H01L 2224/05624; H01L 2224/05644; H01L 2224/05655; H01L 2224/05664; H01L 2224/0603; H01L 2224/13111; H01L 2224/13144; H01L 2224/13147; H01L 2224/13155; H01L 2224/1403; H01L 2224/16145; H01L 2224/16265; H01L 2924/014; H01L 2924/1205; H01L 2924/19011; H01L 2924/19042; H01L 2924/1905; H01L 24/17; H01L 23/492; H01L 23/49537; H02M 3/003; H02M 3/158; H10D 1/20; H10D 1/68
USPC .................................................. 257/758, 750
See application file for complete search history.

(56) References Cited

U.S. PATENT DOCUMENTS

| | | |
|---|---|---|
| 2002/0098677 A1 | 7/2002 | Ahn et al. |
| 2002/0105083 A1 | 8/2002 | Sun et al. |
| 2002/0158337 A1 | 10/2002 | Babich et al. |
| 2007/0226998 A1 | 10/2007 | Olson et al. |
| 2020/0221578 A1* | 7/2020 | Chung ................ H05K 3/188 |
| 2021/0243880 A1* | 8/2021 | Bauer ................. H05K 3/4076 |
| 2023/0027090 A1 | 1/2023 | Sturcken et al. |

OTHER PUBLICATIONS

International Search Report for PCT Application No. PCT/US2023/060146, dated Jun. 27, 2023.

* cited by examiner

MULTI-LAYERED METAL FRAME POWER PACKAGE

CROSS-REFERENCE TO RELATED APPLICATIONS

This application claims priority to U.S. Provisional Application No. 63/266,473, titled "Multi-Layered Metal Frame Power Package," filed on Jan. 6, 2022, which is hereby incorporated by reference.

TECHNICAL FIELD

This application relates generally to microelectronic devices.

BACKGROUND

As integration of voltage converters with high-performance processors is required to improve power-supply regulation and thus processor performance, reducing the size of the voltage converter is critical to optimize the implementation. Multiple solutions have been developed to co-package the converter integrated circuit (IC) with the passive components, typically including an inductor and two capacitors (input and output side); among them: (1) utilizing an organic substrate or a metallic lead frame to support the various components being soldered side-by-side, (2) developing surface-mountable passive components to be attached landside or backside of the processor substrate, and (3) implementing all the components within an integrated silicon process.

Solution (1) is the simplest from a manufacturing standpoint, but it is quite large, since there is no substantial advantage relative to placing all components on the PC board, except for a reduction of component spacing. Solution (2) minimizes the size of each individual component by reducing the package footprint, but it does not take advantage of co-packaging the components to minimize the total volume of the solution. Solution (3) is the ultimate approach to size reduction, since the passive components are implemented directly on the converter silicon die by utilizing appropriate silicon-compatible technologies like trench capacitors and inductors embedded in the metal back-end of the processor. Although this last solution is the most compact, it has significant limitations in the performance of the integrated inductor, due to limitations imposed by silicon processing technology; specifically, it is very difficult to achieve large value inductors that can actually withstand significant current without incurring core saturation effects and other parasitic losses due to the limited thickness of metal traces within the device.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to an electronics assembly comprising: a plurality of planar conductive metal sheets comprising: a first conductive metal sheet; a second conductive metal sheet attached and electrically coupled to the first metal sheet; and a third conductive metal sheet attached and electrically coupled to the second metal sheet, the second metal sheet located between the first and third conductive metal sheets, wherein air gaps are defined in the plurality of planar conductive metal sheets to form metal traces that define electrically isolated conductive paths from an outer surface of the first conductive metal sheet to an outer surface of the third conductive metal sheet in a multilevel conductive wiring network.

In one or more embodiments, each conductive path has a respective aspect ratio in a range of about 2 to about 10, the respective aspect ratio calculated as a ratio of a height of each conductive path to a width of each conductive path, the height measured in a direction orthogonal to a major plane of a respective planar conductive metal sheet, the width measured in a direction orthogonal to a current flow direction and parallel to the major plane, and each conductive path has a length measured in a direction parallel to the current flow and to the major plane, the length larger than the width. In one or more embodiments, a cavity is defined through at least the first conductive metal sheet, the cavity configured to receive a first magnetic slab, a first capacitor, and/or a first integrated circuit. In one or more embodiments, the cavity is a first cavity, and a second cavity is defined through at least the third conductive metal sheet, the second cavity configured to receive a second magnetic slab, a second capacitor, and/or a second integrated circuit.

In one or more embodiments, the conductive paths includes a high-inductance conductive path that has an inductance of at least about 500 pH, the high-inductance conductive path configured to conduct a current laterally on one or more of the planar conductive metal sheets located between the first and second cavities. In one or more embodiments, a first magnetic slab is located in the first cavity, a second magnetic slab is located in the second cavity, and the first and second magnetic slabs are configured and arranged to increase the inductance of the high-inductance path compared to when the first and second magnetic slabs are not located in the first and second cavities, respectively. In one or more embodiments, each magnetic slab has a magnetic permeability that is higher than about 10 and a loss tangent less than about 1 at current a frequency of 100 MHz. In one or more embodiments, each magnetic slab includes a plurality of electrically-insulated laminations of a ferromagnetic material.

In one or more embodiments, the high-inductance path is a first high-inductance path, the conductive paths include a second high-inductance path that has an inductance of at least about 500 pH, and the first and second high-inductance paths are inversely coupled such that the current flowing through the first and second high-inductance paths produces first and second magnetic flux, respectively, the first and second magnetic flux at least partially canceling each other. In one or more embodiments, the first and second high-inductance paths each conduct the current over more than about 50% of a length of the multilevel conductive wiring network. In one or more embodiments, the first and second high-inductance paths terminate on a respective capacitor. In one or more embodiments, a space between the first and second high-inductance paths is filled with a ferromagnetic-polymer composite material that include soft ferromagnetic particles embedded in a polymer matrix.

In one or more embodiments, a width of each metal trace is less than about 140 microns, the width orthogonal to a direction of current flow within a major plane of a respective planar conductive metal sheet. In one or more embodiments, a cross-sectional area of the multilevel conductive wiring network in each planar conductive metal sheet is within a range of about 30% to about 100% of the cross-sectional area of a respective planar conductive metal sheet. In one or more embodiments, at least one of the planar conductive metal sheets includes a partial-height metal segment in which a partial-height air gap is defined between the partial-height metal segment and a neighboring planar conductive metal sheet, the partial-height air gap electrically isolating the partial-height metal segment. In one or more embodiments, the first conductive metal sheet has a different material composition than the second conductive metal sheet. In one or more embodiments, each of the planar conductive metal sheets comprises a first metal and the planar conductive metal sheets are bonded with a second metal that is different than the first metal. In one or more embodiments, the first metal comprises copper, the second metal comprises tin, and a solder bond comprising an intermetallic compound of the first and second metals is formed between neighboring planar conductive metal sheets.

In one or more embodiments, a composition of bonds between neighboring planar conductive metal sheets is the same as a composition of the neighboring planar conductive metal sheets. In one or more embodiments, the conductive paths include a high-inductance conductive path that has an inductance of at least 500 pH. In one or more embodiments, the high-inductance conductive path extends parallel to a major plane of one of the conductive metal sheets.

Another aspect of the invention is directed to an electronics assembly comprising: a plurality of metal traces that define conductive paths from a top level to a bottom level of a multilevel conductive wiring network, wherein air gaps are defined between the metal traces to electrically isolate the conductive paths; and a microchip attached and electrically coupled to the top level of the multilevel conductive wiring network, wherein: a first cavity is defined through the top level of the multilevel conductive wiring network, and a second cavity is defined through the bottom level of the multilevel conductive wiring network.

In one or more embodiments, the microchip is located over the first cavity. In one or more embodiments, the conductive paths include a high-inductance conductive path that has an inductance of at least 500 pH, the high-inductive conductive path located, at least in part, in the second cavity. In one or more embodiments, one or more capacitors is/are located in the first cavity, the capacitor(s) attached and electrically coupled to the microchip. In one or more embodiments, a terminal of the high-inductance conductive path is electrically coupled to a first capacitor through the microchip. In one or more embodiments, first and second magnetic slabs are located in the second cavity, the high-inductive conductive path located between the first and second magnetic slabs, the high-inductive conductive path magnetically coupled to the first and second magnetic slabs to form a magnetic inductor.

In one or more embodiments, the microchip and the high-inductance path form a power converter. In one or more embodiments, the capacitor(s) have independent electrical networks for an input power supply and an output power supply associated with the power converter. In one or more embodiments, a first terminal of the high-inductance path is electrically coupled to a first capacitor and to an input power supply terminal through a half-bridge circuit formed in the microchip, and a second terminal of the high-inductance path is electrically coupled to an output power supply terminal. In one or more embodiments, the half-bridge circuit includes CMOS switches that alternate an electrical coupling of the first terminal of the high-inductance path to the input power supply terminal and to a ground terminal at a frequency of at least about 10 MHz to produce an output voltage at the second terminal of the high-conductance path, the output voltage between an input voltage of the input power supply terminal and a ground voltage at the ground terminal.

In one or more embodiments, the half-bridge circuit is a first half-bridge circuit, the high-inductance conductive path is a first high-inductance conductive path, the conductive paths include a second high-inductance conductive path that has an inductance of at least about 500 pH, the second high-inductive conductive path located, at least in part, in the second cavity, and a first terminal of the second high-inductance path is electrically coupled to a second capacitor and to the input power supply through a second half-bridge circuit formed in the microchip. In one or more embodiments, the second terminal of the first high-inductance path is electrically coupled to a first output power supply terminal, and the second terminal of the second high-inductance path is electrically coupled to a second output power supply terminal. In one or more embodiments, the conductive paths through the first high-inductance path, the first capacitor, and the first half-bridge circuit comprise a first independent electrical network, and the conductive paths through the second high-inductance path, the second capacitor, and the second half-bridge circuit comprise a second independent electrical network. In one or more embodiments, the first and second capacitors are electrically coupled to a set of ground terminals, and the space between each ground terminal and a respective nearest input power supply terminal is less than about 200 microns.

In one or more embodiments, the first and second capacitors have a capacitance of at least about 200 nF to provide an impedance of less than about 100 mOhms when the first and second bridge circuits operate at a frequency of less than or equal to about 200 MHz. In one or more embodiments, the first and second high-inductance paths are inversely magnetically coupled.

Another aspect of the invention is directed to a method for manufacturing an electronics assembly, comprising: (a) depositing and patterning a first photoresist layer on a first side of a first planar conductive sheet in a plurality of planar conductive sheets; (b) depositing and patterning a second photoresist layer on a second side of the first planar conductive sheet; (c) etching the first and second sides of the first planar conductive sheet according to patterns in the first and second photoresist layers to form conductive traces and air gaps; (d) repeating steps (a)-(c) for each additional planar conductive sheet in the planar conductive sheets; (e) aligning the planar conductive sheets using alignment marks in the planar conductive sheets; and (f) attaching and electrically coupling neighboring planar conductive sheets to form a multilevel wiring structure, the air gaps electrically isolating the multilevel wiring structure such that electrically isolated conductive paths are formed from a bottom level to a top level of the multilevel wiring structure.

BRIEF DESCRIPTION OF THE DRAWINGS

For a fuller understanding of the nature and advantages of the concepts disclosed herein, reference is made to the detailed description of preferred embodiments and the accompanying drawings.

DETAILED DESCRIPTION

An electrically isolated multilevel wiring structure is formed of conductive metal traces that define conductive paths from a top level to a bottom level of a multilevel conductive wiring network. Air gaps are defined between the metal traces to electrically isolate the conductive paths. The multilevel wiring structure can be attached and electrically coupled to a microchip and to one or more capacitors to form a power converter.

The disclosed architecture leverages the thick metal interconnect of a lead frame and the ability to implement a thicker magnetic-material core to overcome performance limitations of silicon-integrated inductors, while still allowing the vertical stacking of all the components to minimize the total volume of the solution.

Figure 1:
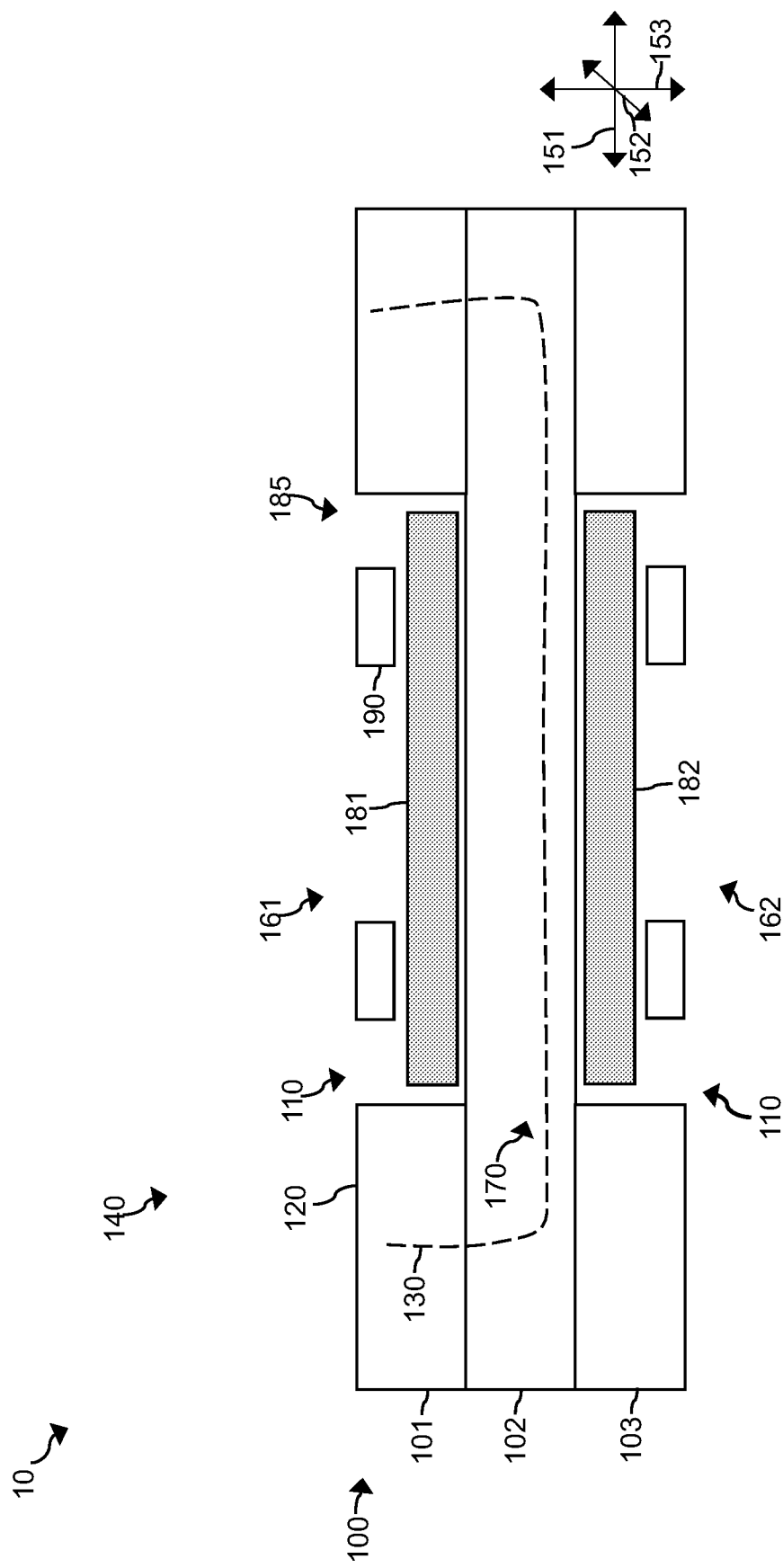
FIG. 1 is a cross-sectional illustration of an electronics assembly according to an embodiment.

FIG. 1 is a cross-sectional illustration of an electronics assembly 10 according to an embodiment. The assembly 10 includes a plurality of conductive metal sheets 100. Air gaps 110 are selectively defined in the conductive metal sheets 100 to form metal traces 120. The metal traces 120 form one or more conductive paths 130 in a multilevel conductive wiring network 140. The air gaps 110 electrically isolate the conductive path(s) 130 without using an insulating material.

The conductive metal sheets 100 include a first conductive metal sheet 101, a second conductive metal sheet 102, and a third conductive metal sheet 103. The neighboring first and second conductive metal sheets 101, 102 are attached and electrically coupled to each other. The neighboring second and third conductive metal sheets 102, 103 are attached and electrically coupled to each other. Neighboring conductive metal sheets 100 can be attached and electrically coupled to each other using solder, a conductive adhesive, and/or a diffusion bonding process. Solder can be applied through an electroless or an electrolytic plating process (e.g., conductive metal sheets 100 are aligned, compressed and reflowed to solder them together). An example solder that can be used is tin, which can form a high strength and high melting temperature intermetallic compound such as $Cu_3Sn$ (e.g., when the conductive metal sheets include copper). In diffusion bonding, the conductive metal sheets 100 are aligned, compressed, and heated to 800° C. or higher to bond the conductive metal sheets 100 without the use of another material.

Each metal sheet 100 can comprise copper, aluminum, lead, or another conductive metal. The conductive metal sheets 100 can be formed of the same or different materials. In an example, one or both of the outer conductive metal sheets 100 (e.g., conductive metal sheets 101 and/or 103) can be formed out of a first material and the inner conductive metal sheet 100 (e.g., conductive metal sheet 102) can be formed out of a second material that is different than the first material. The first material can be more rigid and/or can have a higher mechanical strength than the second material while the second material can have a lower resistivity (or a higher conductivity) than the first material. For example, the first material can be or can include copper 110 (e.g., a first copper alloy) and the second material can be or can include beryllium copper, copper C194, copper C70-25, Eftec-64, and/or another copper alloy (e.g., a second copper alloy).

Each conductive metal sheet 100 has a length, a width, and a height (or thickness) that can be measured with respect to respective axes 151-153, which are mutually orthogonal. The height or thickness of each conductive metal sheet 100 can be about 50 microns to about 150 microns, including about 60 microns, about 70 microns, about 80 microns, about 90 microns, about 100 microns, about 110 microns, about 120 microns, about 130 microns, about 140 microns, and any value or range between any two of the foregoing heights/thicknesses. An aspect ratio of the conductive path 130 can be in the range of about 2 to about 10, including about 4, about 6, about 8, and any value or range between any two of the foregoing values. This high aspect ratio provides a large current density for the assembly 10. The current density is the ratio of the output current that can be supplied by the assembly 10 to the area (e.g., surface area or cross-sectional area) of the assembly 10. As used herein, "about" means plus or minus 10% of the relevant value.

The aspect ratio (AR) can be defined as $$AR = \frac{Height_{CP}}{Width_{CP}}$$

where $Height_{CP}$ is the height of the conductive path 130 (e.g., as measured with respect to axis 153) and Width is the width of the conductive path 130 (e.g., as measured with respect to axis 152 or 153, whichever dimension is smaller). The width of the conductive path 130 is the narrowest feature dimension measured in the direction orthogonal to the direction of travel of current through each metal trace 120 within the major plane of the metal trace 120. For example, when the current travels laterally through the second conductive metal sheet 102 parallel to axis 151 (e.g., along the length of the second conductive metal sheet 102), the width of the current path 130 through the second conductive metal sheet 102 is measured in the direction parallel to axis 152, where the major plane of the second conductive metal sheet 102 is parallel to the plane defined by axes 151, 152.

One or more cavities can be defined in the assembly 10. Each cavity is defined through at least one of the outermost conductive metal sheets 100 (e.g., the first conductive metal sheet 101 or the third conductive metal sheet 103 in the illustrated figure). For example, a first cavity 161 can be defined in the first conductive metal sheet 101 and/or a second cavity 162 can be defined in the third conductive metal sheet 103. Each cavity 161, 162 is configured, sized, and/or arranged to receive and/or embed a magnetic slab (e.g., for an inductor), one or more capacitors, and/or a microchip (e.g., an integrated circuit). For example, a first magnetic slab 181 can be located in the first cavity 161 and/or a second magnetic slab 182 can be located in the second cavity 162. By placing an electronic component, such as a magnetic slab, one or more capacitors, and/or a microchip in the cavities 161, 162, the size and/or footprint of the assembly 10 is reduced compared to when the electronic component is located laterally with respect to the assembly 10.

In some embodiments, the conductive path(s) 130 include a high-inductance conductive path 170 (e.g., a trace inductor) that generally conducts current laterally within the assembly 10, such as parallel to the plane defined by the first and second axes 151, 152. The high-inductance conductive path 170 can have an inductance of at least about 500 pH to about 5 nH in the absence of a high permeability material that may further increase inductance. The path inductance is intentionally increased by designing any current return path to be positioned away from the conductive path 170 by at least about 100 µm so that a current loop is developed with inductance proportional to the cross-sectional area of the loop, which is determined by the distance to the return path. The first and second magnetic slabs 181, 182 are configured and arranged to increase the inductance of the high-inductance path 170. The high-inductance conductive path 170 and the magnetic slabs 181, 182 can form a magnetic inductor 185.

The magnetic slabs 181, 182 can each include a ferromagnetic material such as cobalt, nickel, and/or iron, and/or a compound or alloy comprising cobalt, nickel, and/or iron, such as NiFe and/or CZT ($Co_XZr_YTa_{1-X-Y}$, with X and Y being approximately 0.915 and 0.04, respectively). Each slab may include one or more insulating laminations to suppress the formation of eddy currents within the slab 181, 182, for example as disclosed in U.S. Pat. No. 9,647,053, titled "Systems and Methods for Integrated Multi-layer Magnetic Films," which is hereby incorporated by reference. Each magnetic slab 181, 182 can include a soft ferromagnetic material or a hard ferromagnetic material. In some embodiments, the magnetic slabs 181, 182 and/or the space between the magnetic slabs 181, 182 and the high-inductance path 170 can comprise a ferromagnetic-polymer composite material and/or a ferromagnetic-dielectric material, for example as disclosed in U.S. Pat. No. 10,354,950, titled "Systems and Methods for Microelectronics Fabrication and Packaging Using a Magnetic Polymer" and/or U.S. patent application Ser. No. 17/377,886, titled "Ferromagnetic-Polymer Composite Material and Structures Comprising Same," filed on Jul. 16, 2021, which are hereby incorporated by reference. For example, the ferromagnetic-polymer composite material can include a polymer and a plurality of ferromagnetic film platelets disposed in the polymer. Each ferromagnetic film platelet can include at least first and second insulator layers and a ferromagnetic layer disposed between the first and second insulator layers. The ferromagnetic layer can have a hard axis of magnetization of the ferromagnetic layer is aligned parallel to a plane that passes through and is parallel to an interface between the first insulator layer and the ferromagnetic layer. The hard axes of magnetization in the ferromagnetic film platelets can also be aligned. The ferromagnetic layer can also include a hard ferromagnetic layer (e.g., having a magnetic coercivity of at least about 100 Oe) and/or a soft ferromagnetic layer (e.g., having a magnetic coercivity of less than or equal to about 1 Oe), which can be magnetically coupled to each other. Additionally or alternatively, the ferromagnetic-polymer composite material can include soft ferromagnetic particles embedded in a polymer matrix.

In some embodiments, one or both magnetic slabs 181, 182 is/are enclosed in a coupon, a housing, or another structure, which is attached to one of the conductive metal sheets such as conductive metal sheet 102. Each magnetic slab 181, 182 can have a height or thickness, as measured with respect to axis 153, of less than or equal to about 60 microns, including about 50 microns, about 40 microns, about 30 microns, about 20 microns, about 10 microns, and any value or range between any two of the foregoing heights/thicknesses.

The magnetic slabs 181, 182 can each have a relative magnetic permeability higher than or equal to 10 and in the range of about 10 to about 1,000 and can have low magnetic coercivity such as less than about 1 Oersted and low power losses at current frequencies higher than 100 MHz, with a loss tangent of about 1 or less at 100 MHz (e.g., about 0.1 to about 1). The magnetic slabs 181, 182 can be magnetically coupled to the high-inductance path 170 to increase the inductance of the high-inductance path 170. For example, the magnetic flux from the high-inductance path 170 can pass through the first and/or second magnetic slabs 181, 182.

The high-inductance conductive path 170 can be configured to conduct current over at least about 50% of the length of the multilevel conductive wiring network 140, as measured with respect to the first axis 151. In some embodiments, the high-inductance conductive path 170 is configured to conduct current over about 50% to about 100% of the length of the multilevel conductive wiring network 140. The high-inductance path 170 can start on one side of the multilevel conductive wiring network 140.

Metal traces 120 in partial-height segments 190 allow current to flow through laterally (e.g., parallel to axis 152) while remaining electrically isolated from the neighboring conductive metal sheet 100 (e.g., neighboring conductive metal sheet 102) due to the air gap 110 formed therebetween. The partial-height segments 190 can be formed by partially removing (e.g., partially etching) the conductive metal sheets 101, 103 to form the air gaps 110 while leaving the partial-height segments 190.

Electronics assembly 10 can function as a lead frame to package a semiconductor die.

Figure 2:
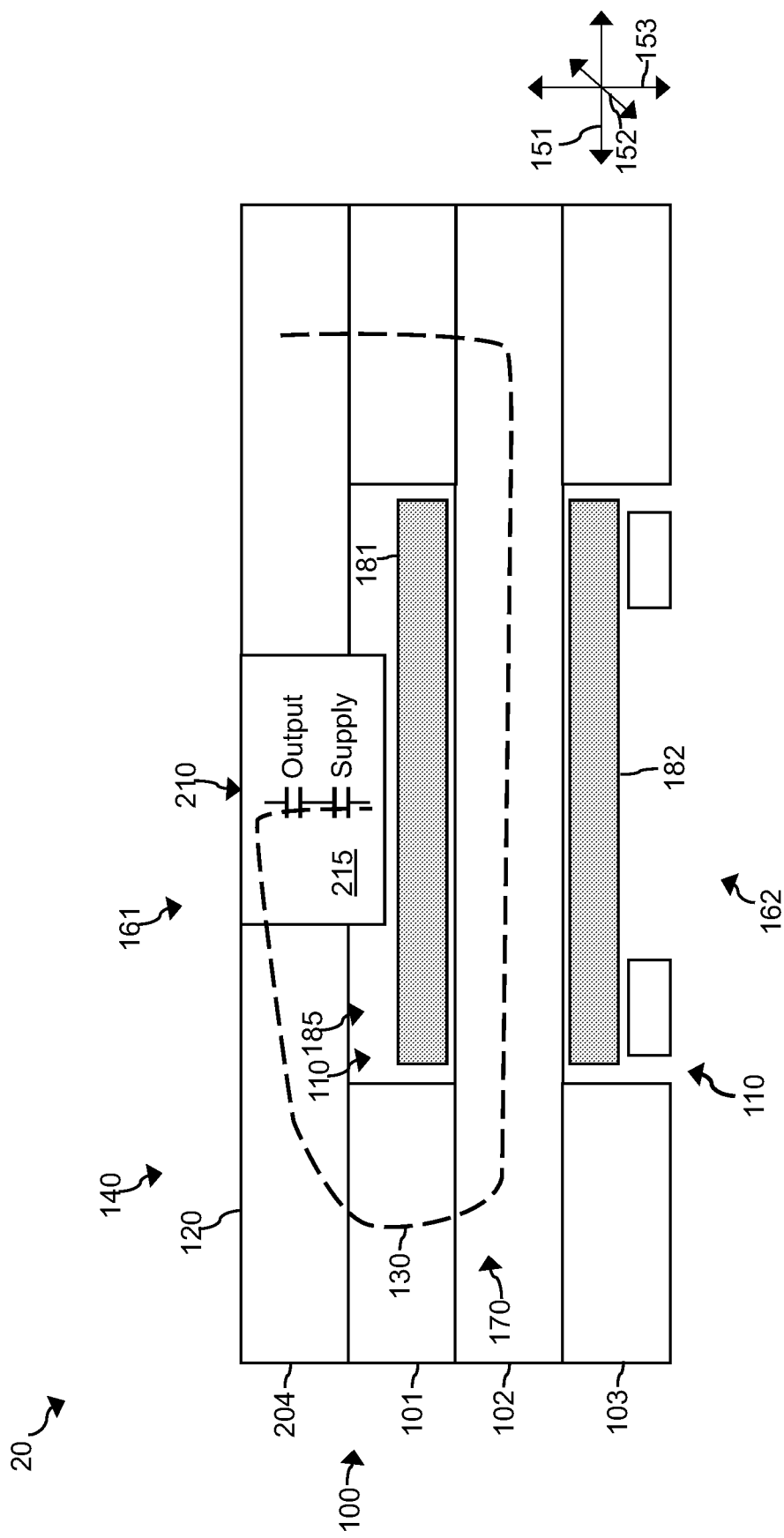
FIG. 2 is a cross-sectional illustration of an electronics assembly according to another embodiment.

FIG. 2 is a cross-sectional illustration of an electronics assembly 20 according to another embodiment. Assembly 20 is the same as assembly 10 except that assembly 20 includes a fourth conductive metal sheet 204, which can be the same as or different than conductive metal sheet 101, 102, or 103. The first cavity 161 is defined in the first and fourth conductive metal sheets 101, 204, which allows one or more capacitors 210 to be located in the first cavity 161 above the first magnetic slab 181. The capacitor(s) 210 can include an output capacitor and/or a supply capacitor. The conductive path 130 and/or the high-conductive path 170 can terminate on the capacitor(s) 210. The capacitor(s) 210 can be formed in a capacitor die 215 which can be a deep-trench capacitor (DTC) die. The capacitor die 215 can have a height or thickness, as measured with respect to axis 153, of about 20 microns to about 150 microns, including about 25 microns, about 50 microns, 100 microns, about 125 microns, and any value or range between any two of the foregoing heights/thicknesses.

Electronics assembly 20 can function as a lead frame to package a semiconductor die.

Figure 3:
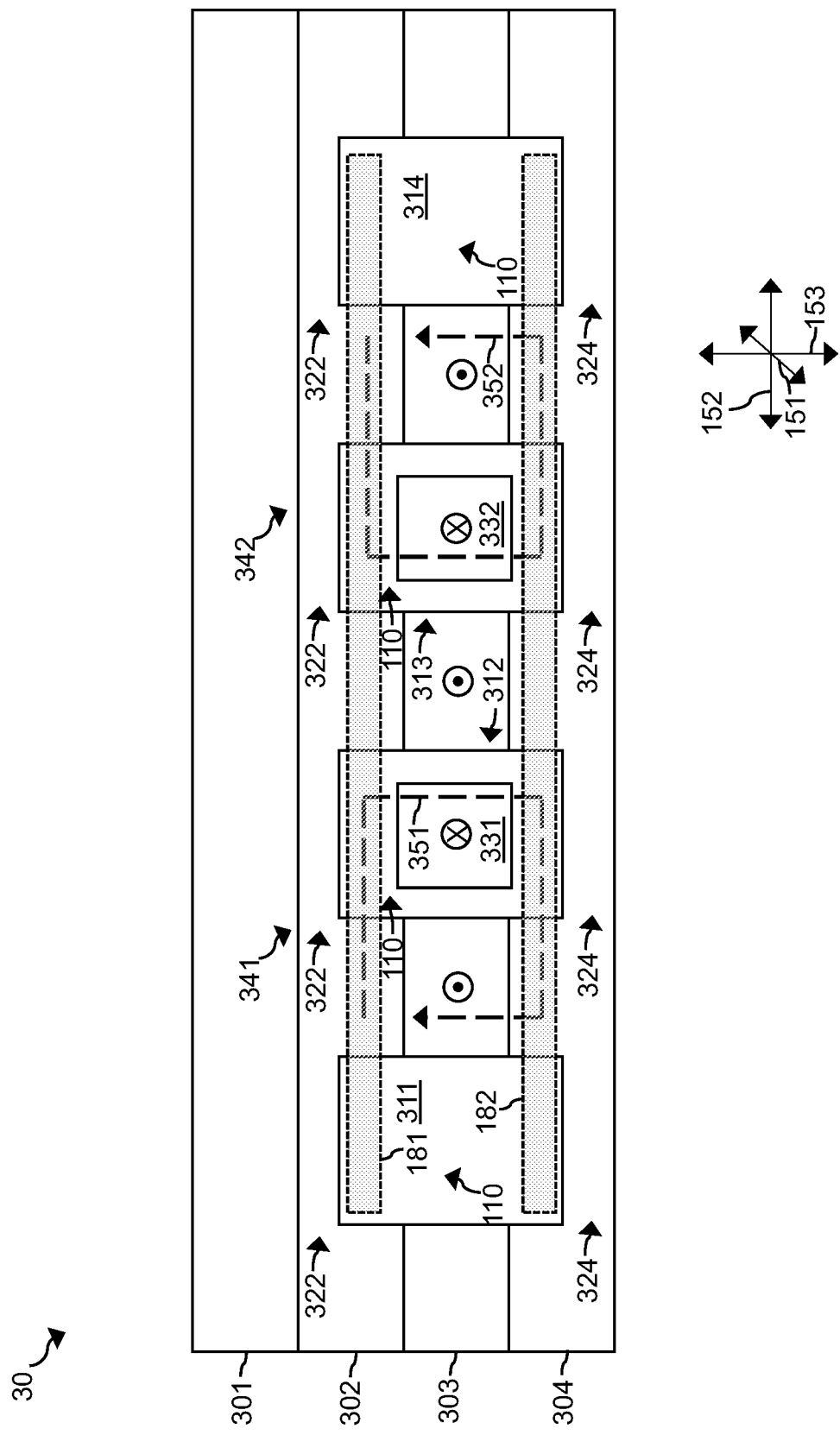
FIG. 3 is a cross-sectional illustration of an electronics assembly according to another embodiment.

FIG. 3 is a cross-sectional illustration of an electronics assembly 30 according to another embodiment. The assembly 30 includes conductive metal sheets 301-304 which can be the same as or different than conductive metal sheets 101-103, 204, respectively. The cross section of electronics assembly 30 can be taken from a plane (e.g., from a plane parallel to the plane defined by axes 151, 153) orthogonal to the planes taken for the cross sections of the electronics assemblies 10, 20 (e.g., from a respective plane parallel to the plane defined by axes 152, 153).

Cavities 311-314 are formed in conductive metal sheets 301-303. The cavities 311-314 include air gaps 110 that electrically isolate the conductive path(s) formed in the conductive metal sheets 301-304. The cavities 311-314 extend through the height of conductive metal sheet 303 (e.g., in a direction parallel to axis 153) and partially through the height of conductive metal sheets 302, 304 (e.g., in partial-height segments 322, 324 of conductive metal sheets 302, 304, respectively). In one example, the conductive metal sheet 303 can be fully removed (e.g., etched) in the regions corresponding to cavities 311-314 while the conductive metal sheets 302, 304 can be partially removed (e.g., etched) in the regions corresponding to cavities 311-314.

The partial removal of conductive metal sheets 302, 304 allows current to flow laterally (e.g., parallel to axis 152) through the respective conductive metal sheets 302, 304 while enlarging the height (as measured parallel to axis 153) of the cavities 311-314 such that an air gap 110 is defined between the partial-height segments 322, 324 and high-inductive path segments 331, 332 in cavities 312, 313, respectively.

A plurality of magnetic inductors are formed in the assembly 30. The magnetic inductors include a first magnetic inductor 341 and a second magnetic inductor 342. Each magnetic inductor 341, 342 can be formed in the same or similar manner as high-inductance conductive path 170 (FIGS. 1, 2). The first and second magnetic inductors 341, 342 can be configured and arranged so as to be inversely magnetically coupled to each other. When the magnetic inductors 341, 342 are inversely magnetically coupled, the magnetic flux 351 produced by current flowing through the first magnetic inductor 341 partially or fully cancels the magnetic flux 352 produced by current flowing through the second magnetic inductor 342 to reduce or eliminate the net magnetic flux from the magnetic inductors 341, 342, which can otherwise cause saturation of the magnetic slabs 181, 182. In some embodiments, the magnetic slabs 181, 182 can be placed or configured in a manner that increases magnetic coupling across two or more magnetic inductors 341, 342 for the purpose of reducing output voltage ripple, or inductor current ripple and the related impact of magnetic saturation or alternatively for the purpose of transferring power from one inductor to the next.

Electronics assembly 30 can function as a lead frame to package a semiconductor die.

Figure 4:
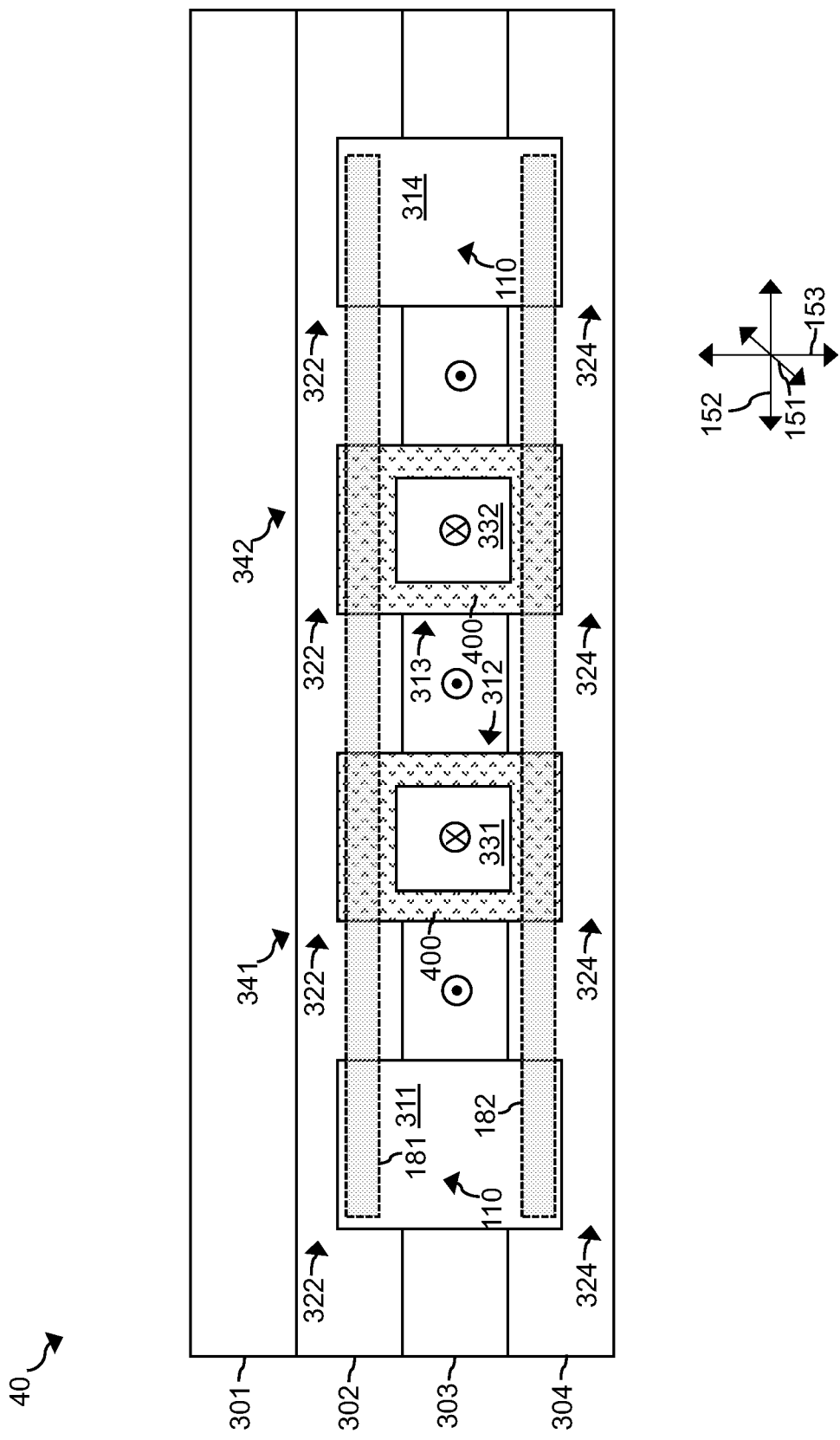
FIG. 4 is a cross-sectional illustration of an electronics assembly according to another embodiment.

FIG. 4 is a cross-sectional illustration of an electronics assembly 40 according to another embodiment. Electronics assembly 40 is the same as electronics assembly 30 except that in electronics assembly 40, cavities 312, 313 are filled with a ferromagnetic polymer material 400 that includes ferromagnetic particles and/or ferromagnetic film platelets in a polymer matrix. The ferromagnetic particles can have an average particle size of about 50 microns or less, such as about 1 micron to about 50 microns, including about 10 microns, about 20 microns, about 30 microns, about 40 microns, or any value or range between any two of the forgoing average particle sizes. The ferromagnetic polymer material 400 can have a high relative magnetic permeability ranging from about 2 to about 1,000. Additional details regarding the ferromagnetic polymer material 400 are disclosed in U.S. Pat. No. 10,354,950, titled "Systems and Methods for Microelectronics Fabrication and Packaging Using a Magnetic Polymer" and/or U.S. patent application Ser. No. 17/377,886, titled "Ferromagnetic-Polymer Composite Material and Structures Comprising Same."

Certain reference numbers used in electronics assembly 30 are not used in electronics assembly 40 for purposes of illustration clarity only. For example, the magnetic flux 341, 342 illustrated in FIG. 3 are not illustrated in FIG. 4 so as to illustrate electronics assembly 40 more clearly. However, electronics assembly 40 is configured to produce the same magnetic flux 341, 342.

Figure 5:
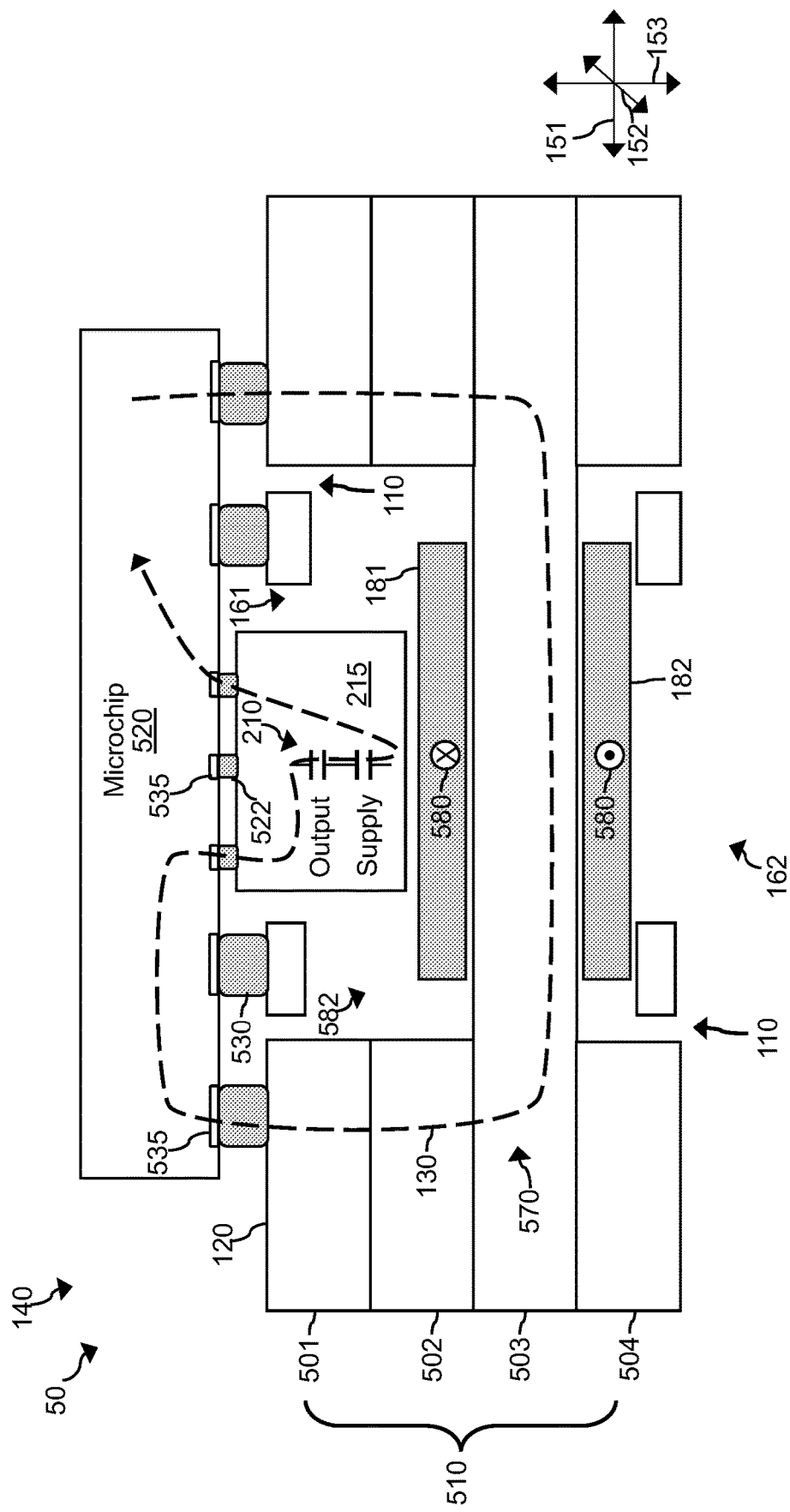
FIG. 5 is a cross-sectional illustration of an electronics assembly according to another embodiment.

FIG. 5 is a cross-sectional illustration of an electronics assembly 50 according to another embodiment. The assembly 50 includes conductive metal sheets 501-504 which can be the same as or different than conductive metal sheets 101-103, 204, respectively, and/or conductive metal sheets 301-304, respectively. The conductive metal sheets 501-504 form a lead frame 510 to package a microchip 520.

The microchip 520 is attached and electrically connected to the first conductive metal sheet 501 using studs or pillars 530, which can comprise gold or copper. For example, copper pillars with solder caps (e.g., tin-gold solder caps) can be thermo-compression bonded to the first conductive metal sheet 501 and the microchip 520. In another example, gold studs or pillars can be thermo-compression bonded to the first conductive metal sheet 501 and the microchip 520. In some embodiments, one or more conductive metal sheets (e.g., the first conductive metal sheet 501) of the lead frame 510 can be gold plated, which can enhance or increase the bond strength between the studs or pillars 530, the lead frame 510, and the microchip 520. The studs or pillars 530 can have a height or thickness, as measured with respect to axis 153, of about 35 microns to about 70 microns, including about 40 microns, about 45 microns, about 50 microns, about 55 microns, about 60 microns, about 65 microns, and any other value or range between any two of the foregoing heights/thicknesses.

The microchip 520 is attached and electrically coupled to the capacitor(s) 210 using micro-bumps 522 or another technique or process. The micro-bumps 522 can include copper (e.g., about 8 microns), nickel (e.g., about 2 microns), and tin (e.g., about 25 microns). The capacitor(s) 210 can include an output capacitor and/or a supply capacitor. The capacitor(s) 210 can comprise silicon and/or another material. The capacitor(s) 210 can be formed in a capacitor die 215 which can be a deep-trench capacitor (DTC) die. The capacitor die 215 can have a height or thickness, as measured with respect to axis 153, of about 20 microns to about 150 microns, including about 25 microns, about 50 microns, 100 microns, about 125 microns, and any value or range between any two of the foregoing heights/thicknesses.

The studs/pillars 530 and micro-bumps 522 can be formed on pads 535 on the microchip 520. The pads 535 can be formed of aluminum and nickel, palladium, and gold. The nickel, palladium, and gold can be deposited using an ENEPIG (electroless nickel electroless palladium immersion gold) process. The pads 535 can also be formed of aluminum, nickel, and gold (omitting the palladium) to reduce cost.

One or more high-inductance conductive paths 570 (e.g., trace inductor(s)) is/are formed in the lead frame 510, for example in conductive metal sheet 503. The high-inductance conductive path(s) 570 are formed with metal traces that can be long (e.g., with respect to axis 151) and thin (e.g., with respect to axis 152) to implement inductive elements. For example, the length of the metal traces through layer 503 can represent 50% to 100% of the length of the lead frame 510 and/or assembly 50, as measured with respect to axis 151. The width of the metal traces through layer 503 can be about 70 microns to about 140 microns including about 80 microns, about 90 microns, about 100 microns, about 110 microns, about 120 microns, about 130 microns, and any value or range between any two of the foregoing widths. The width of the metal traces is directly proportional to the resistance of the metal trace which is related to the inductance of high-inductance path(s) 570. The width of the metal traces is the dimension within the major plane of the conductive metal sheet that is orthogonal to the current flow. The magnetic slabs 181, 182 are magnetically coupled to the high-inductance path 570 to increase the inductance of the high-inductance path 570. For example, the magnetic flux 580 from the high-inductance path 570 can pass through the magnetic slabs 181, 182. The high-inductance path 570 and the magnetic slabs 181, 182 can form a magnetic inductor 582.

The metal traces can be straight, curved, and/or another shape to customize the inductance value of the high-inductance conductive path(s) 570. The high-inductance conductive path(s) 570 can extend across the contacts formed by the studs/pillars 530. For example, the high-inductance conductive path(s) 570 can extend across the output- and supply-side contacts of the microchip 520. The high-inductance conductive path(s) 570 and capacitor(s) 210 can function as a filter, such as a high-pass filter or a low-pass filter. The location of the capacitor(s) 210 in the first cavity 161 reduces and/or minimizes the length of the loop of the current such that it is no wider than the microchip 520. The high-inductance conductive path(s) 570 and/or the capacitor(s) 210 can also form a portion of a DC-DC voltage converter in combination with the microchip 520. The DC-DC voltage converter can include multiple phases. Each phase can be coupled to a respective high-inductance conductive path 570.

Figure 6:
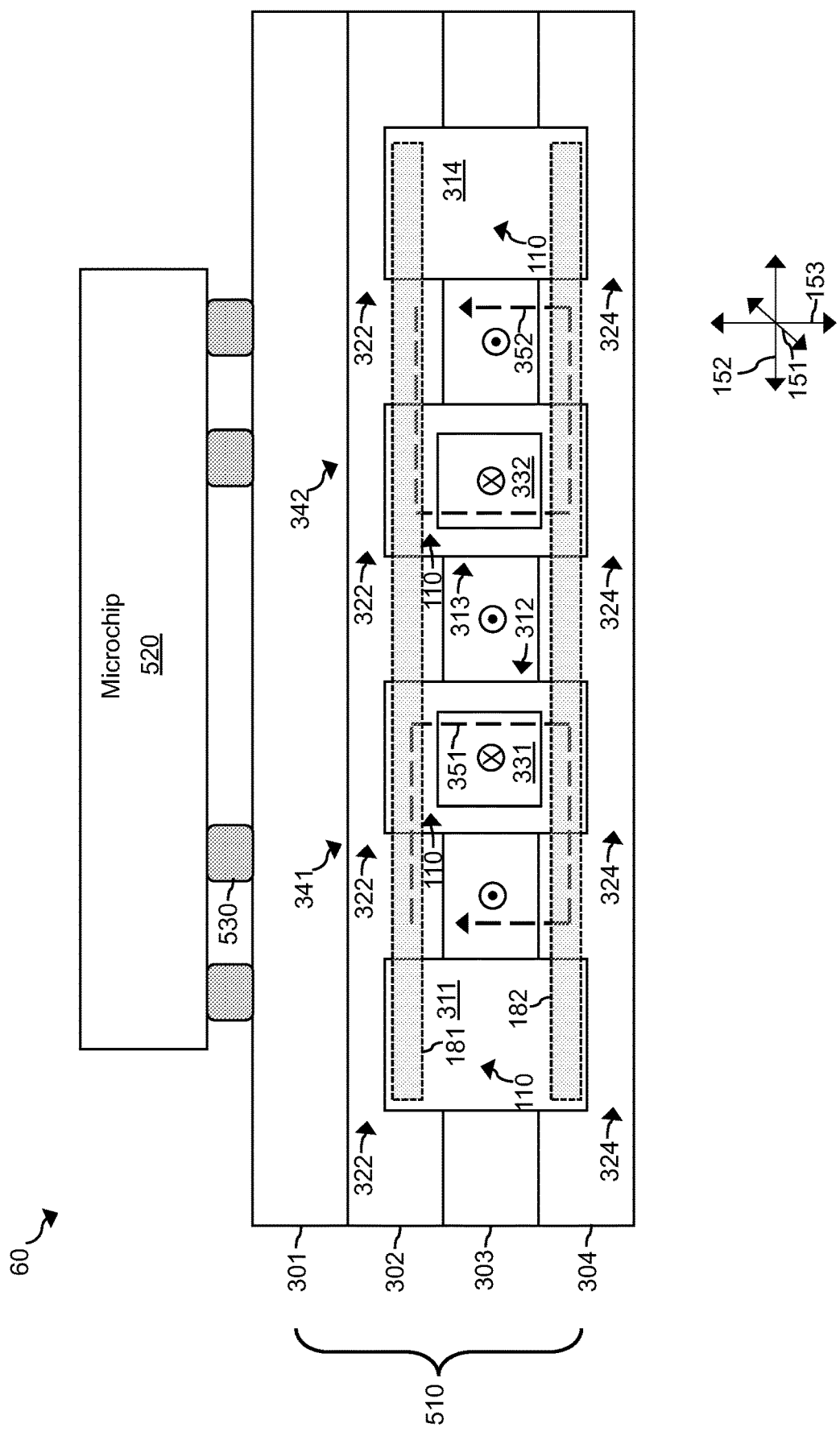
FIG. 6 is a cross-sectional illustration of electronics assembly according to another embodiment.

FIG. 6 is a cross-sectional illustration of electronics assembly 60 according to another embodiment. Electronics assembly 60 is the same as electronics assembly 30 except that electronics assembly 60 includes a microchip 520 is attached and electrically coupled to conductive metal sheet 301 with studs or pillars 530. The conductive metal sheets 301-304 form a lead frame 510 to package the microchip 520. Electronics assembly 60 can be the same electronics assembly 50 where the cross section of electronics assembly 60 is taken from a plane (e.g., from a plane parallel to the plane defined by axes 152, 153) orthogonal to the plane taken for the cross section of electronics assembly 50 (e.g., from a plane parallel to the plane defined by axes 151, 153).

The microchip 520 can be attached and electrically coupled to the capacitor(s) 210, as in electronics assembly 50, though the capacitor(s) is/are not viewable in the cross section illustrated in FIG. 6.

Figure 7:
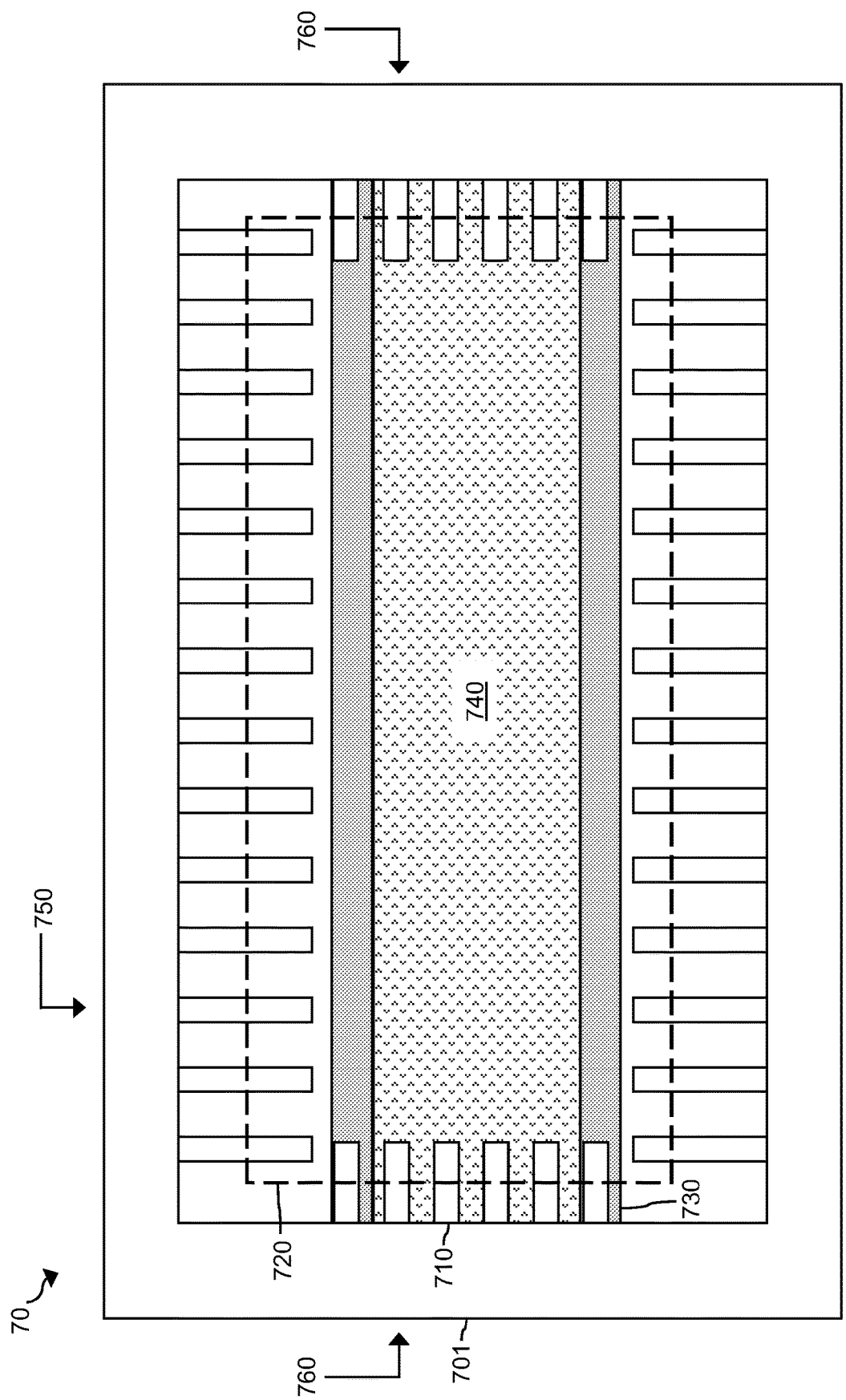
FIG. 7 is a top view of an electronics assembly according to an embodiment.

FIG. 7 is a top view of an electronics assembly 70 according to an embodiment. Electronics assembly 70 can be the same as electronics assembly 10, 20. 30, or 50.

The electronics assembly 70 includes an array of electrical connectors 710 on the top conductive metal sheet 701 that are configured to form electrical connections with an optional microchip 720. Microchip 720 can be the same as or different than microchip 520. Partial-height segments 730 are formed in a conductive metal sheet below the top conductive metal sheet 701. The partial-height segments 730 function as conductive bridges or flyovers across the assembly 70 while preventing electrical shorting with conductive segments in neighboring conductive metal sheets. Partial-height segments 730 can be the same as or different than partial-height segments 190.

The electronics assembly 70 also includes at least one magnetic slab 740, which can be the same as or different than magnetic slab(s) 181, 182.

The cross sections illustrated in FIGS. 1, 2, and/or 5 can represent a cross section of electronics assembly 70 through plane 750. The cross sections illustrated in FIGS. 3, 4, and/or 6 can represent a cross section of electronics assembly 70 through plane 760.

Figure 8:
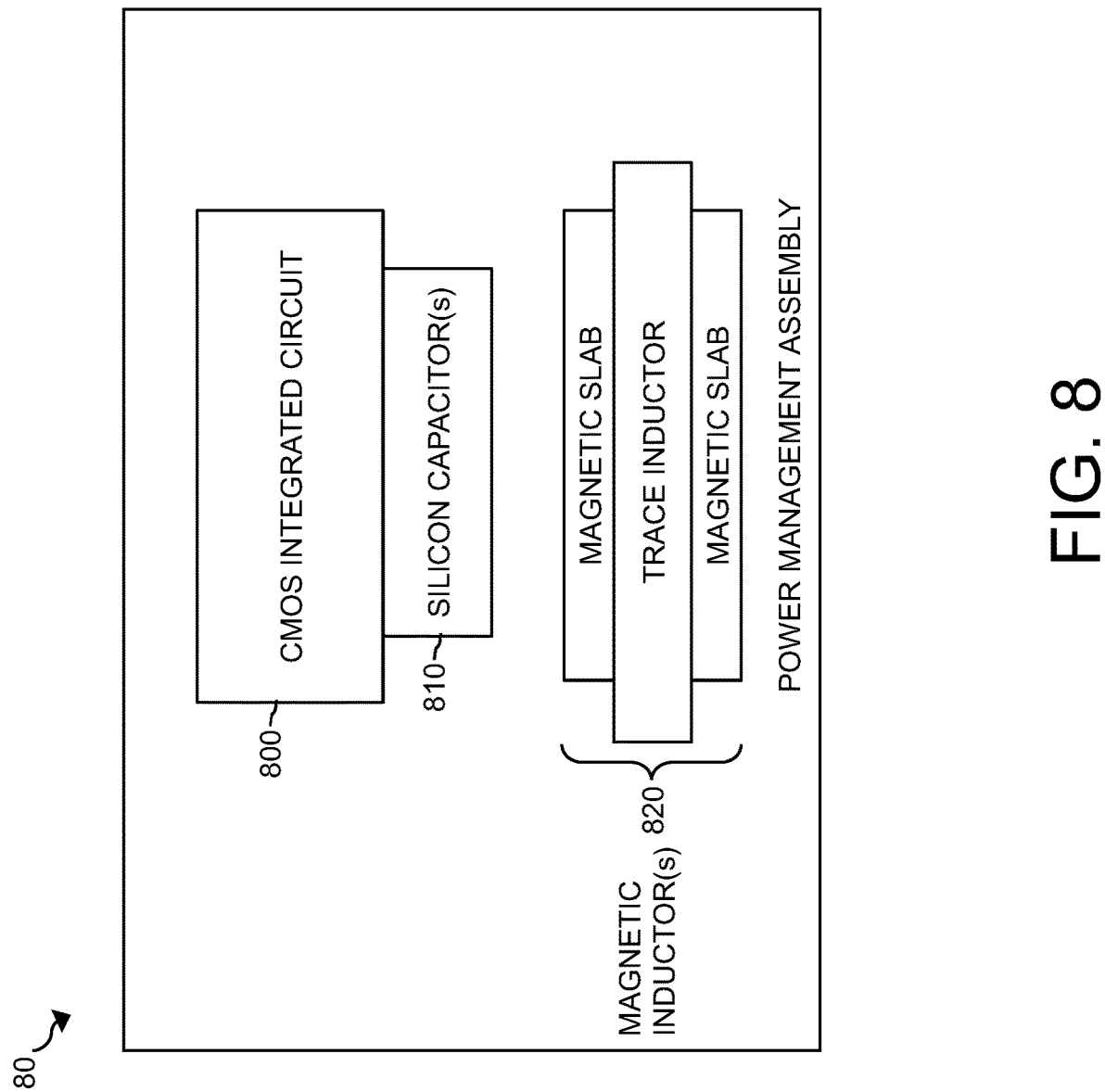
FIG. 8 is a block diagram of a power management assembly according to an embodiment.

FIG. 8 is a block diagram of a power management assembly 80 according to an embodiment. The power management assembly 80 can be the same as electronics assembly 50, 60, and/or 70. The power management assembly 80 includes a CMOS (complementary metal-oxide semiconductor) integrated circuit 800, silicon capacitor(s) 810, and magnetic inductor(s) 820. The CMOS integrated circuit 800 can be the same as microchip 520 and/or 720. The silicon capacitor(s) 810 can be the same as capacitor(s) 210 (e.g., in capacitor die 215). The magnetic inductor(s) 820 can be the same as magnetic inductor(s) 185, 341, 342, and/or 582.

Figure 9:
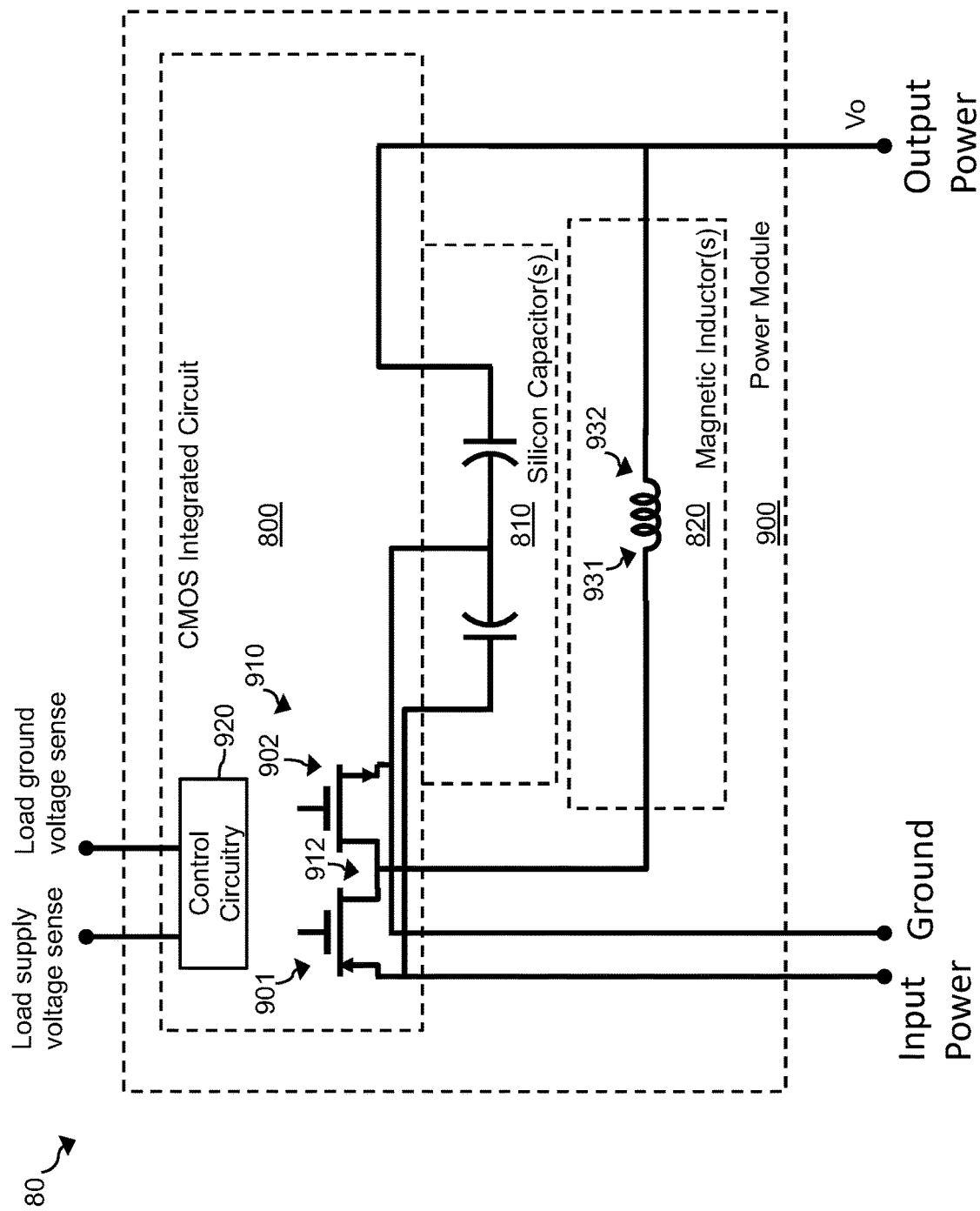
FIG. 9 is a schematic circuit representation of an implementation of the power management assembly illustrated in FIG. 8 that includes a switched inductor DC-DC power converter.

FIG. 9 is a schematic circuit representation of an implementation of power management assembly 80 that includes a switched inductor DC-DC power converter. The CMOS integrated circuit 800 includes a CMOS power switch that includes a PMOS (p-channel metal-oxide-semiconductor) transistor gate 901 and an NMOS (n-channel metal-oxide-semiconductor transistor) gate 902 to form a half-bridge circuit 910 in a switched inductor DC-DC power converter 900.

Each transistor gate 901, 902 can include two switches in series in a cascode configuration for the purpose of increasing the voltage that the switch can reliably block. In some embodiments, both the high-side and low-side switches are comprised of NMOS transistors (e.g., NMOS transistor gate 902).

Feedback control circuitry 920 is configured to open and close PMOS and NMOS transistor gates 901, 902. When a PMOS transistor gate 901 is open, the corresponding NMOS transistor gate 902 is closed and vice versa. Opening and closing the PMOS and NMOS transistor gates 901, 902 generates a corresponding pulse width modulation (PWM) signal at the output of half-bridge node 912. The frequency of the PWM signal can be configured in the feedback control circuitry 920 as known in the art. The frequency of the PWM signal is preferably at least about 10 MHz such as about 50 MHz, about 100 MHz, about 150 MHz, about 200 MHz, about 250 and/or another frequency which can include any value or range between any two of the foregoing frequencies. The PWM signal can be configured to produce an output voltage at the output terminal 932 of the magnetic inductor 820 that is between ground (e.g., ground voltage at the ground terminal) and the output power supply voltage (e.g., at the output power supply terminal).

Feedback control circuitry 920 adjusts the duty cycle of the PWM signal to raise or lower the output voltage Vo so that the output voltage Vo equals a target output voltage, that could range from 0 volts to the input power supply voltage level. The feedback control circuitry 920 monitors the output voltage Vo through load supply voltage sense and load ground sense feedback lines, as illustrated in FIG. 9. The separate supply voltage sense and ground reference sense lines allow the DC-DC power converter 900 to measure the output voltage at the load independent of the power delivery channel.

The feedback control circuitry 920 calculates a voltage error, which is the difference between the output voltage Vo (e.g., at the outpower power terminal) and the target output voltage. The target output voltage can be set manually or pre-programmed based on the specifications of the load. If there is a positive voltage error (e.g., the output voltage Vo is greater than the target output voltage), the feedback control circuitry 920 can respond by decreasing the duty cycle of the PWM signal generated by the CMOS power switch. If there is a negative voltage error (e.g., the output voltage Vo is less than the target output voltage), the feedback control circuitry 920 can respond by increasing the duty cycle of the PWM signal generated by the CMOS power switch.

The feedback control circuitry 920 can include regulation circuitry that can open and close the PMOS and NMOS transistor gates 901, 902 according to the PWM signal generated by control circuitry 920.

The magnetic inductor 820 and the silicon capacitor(s) 810 can form a low-pass filter. As can be seen, the silicon capacitor(s) 810 are physically attached and electrically coupled to the CMOS integrated circuit 800. The silicon capacitor(s) 810 can have a capacitance of at least about 200 nF for both the input and output power supplies such as about 250 nF to about 10 µF including about 500 nF, about 1 µF, about 3 µF, about 5 µF, about 7 uF, about 9 µF, and any value or range between any two of the foregoing capacitances. The silicon capacitor(s) 810 can provide a low-impedance path (e.g., less than or equal to about 100 mOhm such as about 1 mOhm to about 100 mOhm, including resistive and inductive impedance from the interconnect routing to and from the capacitor) for the input and output power supplies at a PWM frequency of up to about 200 MHz. Both the Input Power and the Output Power nets may be connected to silicon capacitors that are on a common substrate, such as a deep trench capacitor (DTC), with a shared connection to the Ground net that allows alternating current to travel directly from the Output Power net to the Input Power net through the series combination of the two capacitors.

In addition, the input terminal 931 of the magnetic inductor 820 is electrically coupled to the half-bridge node 912. The input terminal 931 of the magnetic inductor 820 is electrically coupled to the input power supply and associated electrical network on the capacitor(s) 810 through a half-bridge circuit (e.g., CMOS power switch) that is formed on the CMOS integrated circuit 800. The output terminal 932 of the magnetic inductor 820 is electrically coupled to the silicon capacitor(s) 810 through an interconnect on the CMOS integrated circuit 800.

Figure 10:
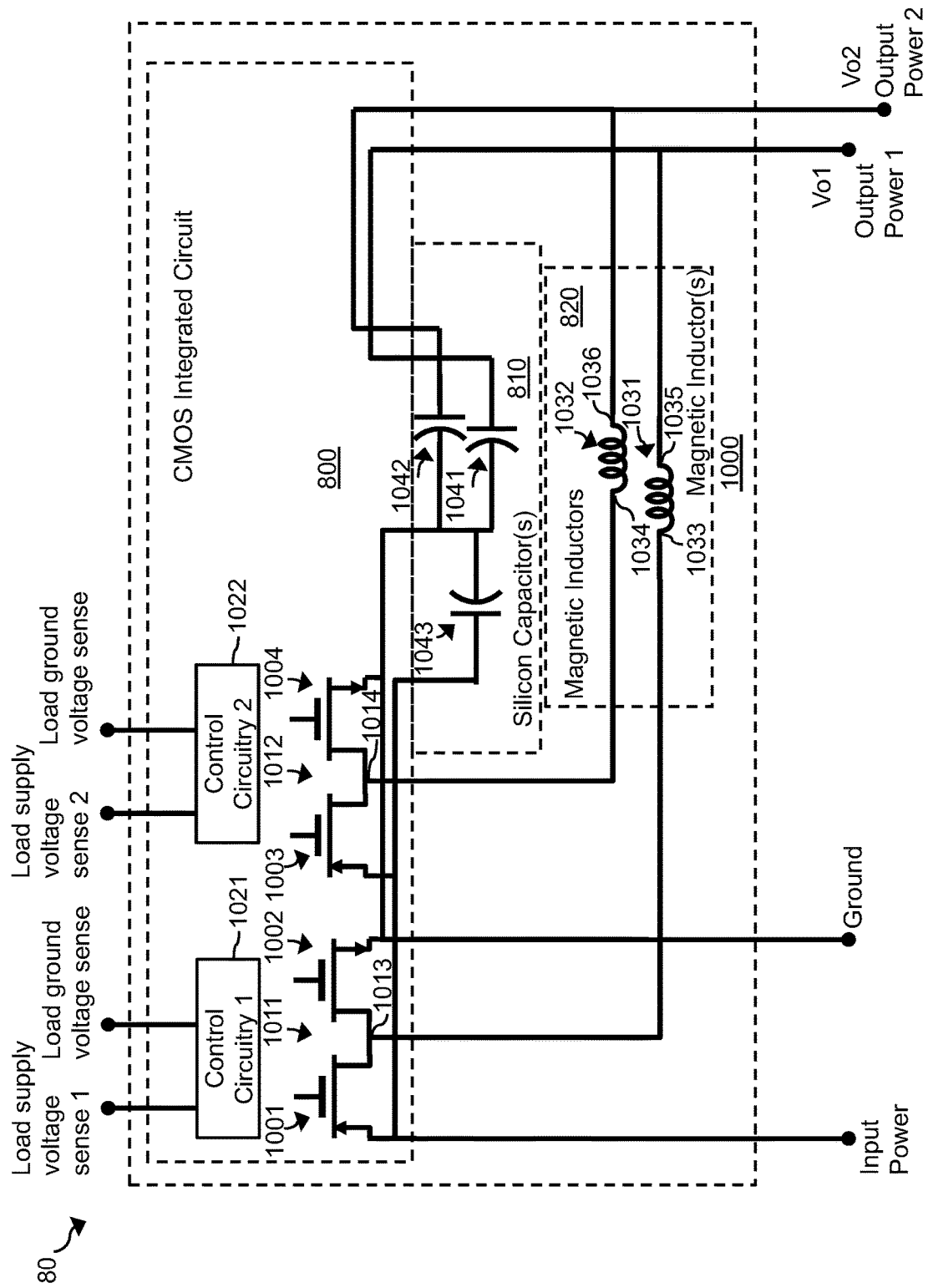
FIG. 10 is a schematic circuit representation of another implementation of power management assembly illustrated in FIG. 8 that includes a switched inductor DC-DC power converter.

FIG. 10 is a schematic circuit representation of another implementation of power management assembly 80 that includes a switched inductor DC-DC power converter 1000. Switched inductor DC-DC power converter 1000 is the same as switched inductor DC-DC power converter 900 except that switched inductor DC-DC power converter 1000 includes two half-bridge circuits to produce two output voltages/powers while switched inductor DC-DC power converter 900 includes one half-bridge circuit to produce one output voltage/power.

The CMOS integrated circuit 800 includes first and second CMOS power switches. The first CMOS power switch includes a PMOS transistor gate 1001 and an NMOS transistor gate 1002 to form a first half-bridge circuit 1011. The second CMOS power switch includes a PMOS transistor gate 1003 and an NMOS transistor gate 1004 to form a second half-bridge circuit 1012. The first and second half-bridge circuits 1011, 1012 can be located on opposite edges of the CMOS integrated circuit 800.

The first half-bridge circuit 1011 is electrically coupled to and controlled by first feedback control circuitry 1021. The second half-bridge circuit 1011 is electrically coupled to and controlled by second feedback control circuitry 1022. The first and second control circuitry 1021, 1022 can be the same as feedback control circuitry 920.

The first feedback control circuitry 1021 is configured to open and close PMOS and NMOS transistor gates 1001, 1002 to produce a first PWM signal at the output of the first half-bridge node 1013. The frequency of the first PWM signal can be configured in the first feedback control circuitry 1021 as known in the art. The frequency of the first PWM signal is preferably at least about 10 MHz such as about 50 MHz, about 100 MHz, about 150 MHz, about 200 MHz, about 250 and/or another frequency which can include any value or range between any two of the foregoing frequencies. The first PWM signal can be configured to produce a first average voltage at the first half-bridge node 1013 that is between ground and the input power supply voltage.

The first feedback control circuitry 1021 adjusts the duty cycle of the first PWM signal to raise or lower the first output voltage Vo1 so that the first output voltage Vo1 equals a first target output voltage, that could range from 0 volts to the input power supply voltage level. The first feedback control circuitry 1021 monitors the first output voltage Vo1 through load supply voltage sense and load ground sense feedback lines, as illustrated in FIG. 10. The separate supply voltage sense and ground reference sense lines allow the DC-DC power converter 1000 to measure the first output voltage at the load independent of the power delivery channel.

The first feedback control circuitry 1021 calculates a first voltage error, which is the difference between the first output voltage Vo1 and the first target output voltage. The first target output voltage can be set manually or pre-programmed based on the specifications of the load. If there is a positive voltage error (e.g., the first output voltage Vo1 is greater than the first target output voltage), the first feedback control circuitry 1021 can respond by decreasing the duty cycle of the first PWM signal generated by the first CMOS power switch. If there is a negative voltage error (e.g., the first output voltage Vo1 is less than the first target output voltage), the first feedback control circuitry 1021 can respond by increasing the duty cycle of the first PWM signal generated by the first CMOS power switch.

The first feedback control circuitry 1021 can include regulation circuitry that can open and close the PMOS and NMOS transistor gates 1001, 1002 according to the first PWM signal generated by the first feedback control circuitry 1021.

The second feedback control circuitry 1022 is configured to open and close PMOS and NMOS transistor gates 1003, 1004 to produce a second PWM signal at the output of the second half-bridge node 1014. The frequency of the second PWM signal can be configured in the second feedback control circuitry 1022 as known in the art. The frequency of the second PWM signal is preferably at least about 10 MHz such as about 50 MHz, about 100 MHz, about 150 MHz, about 200 MHz, about 250 and/or another frequency which can include any value or range between any two of the foregoing frequencies. The frequency of the second PWM signal can be the same as or different than the frequency of the first PWM signal. The second PWM signal can be configured to produce a second average voltage at the second half-bridge node 1014 that is between ground and the input power supply voltage.

The second feedback control circuitry 1022 adjusts the duty cycle of the second PWM signal to raise or lower the second output voltage Vo2 so that the second output voltage Vo2 equals a second target output voltage, such as VDD2. The second feedback control circuitry 1022 monitors the second output voltage Vo2 through load supply voltage sense 2 and load ground sense feedback lines, as illustrated in FIG. 10. The separate supply voltage sense and ground reference sense lines allow the DC-DC power converter 1000 to measure the second output voltage at the load independent of the power delivery channel.

The second feedback control circuitry 1022 calculates a second voltage error, which is the difference between the second output voltage Vo2 and the second target output voltage. The second target output voltage can be set manually or pre-programmed based on the specifications of the load. If there is a positive voltage error (e.g., the second output voltage Vo2 is greater than the second target output voltage), the second feedback control circuitry 1022 can respond by decreasing the duty cycle of the second PWM signal generated by the second CMOS power switch. If there is a negative voltage error (e.g., the second output voltage Vo1 is less than the first target output voltage), the second feedback control circuitry 1022 can respond by increasing the duty cycle of the second PWM signal generated by the second CMOS power switch.

The second feedback control circuitry 1022 can include regulation circuitry that can open and close the PMOS and NMOS transistor gates 1003, 1004 according to the second PWM signal generated by the second feedback control circuitry 1022.

The magnetic inductor(s) 820 in switched inductor DC-DC power converter 1000 includes a first magnetic inductor 1031 and a second magnetic inductor 1032. The first magnetic inductor 1031 and a first silicon capacitor 1041 can form a first low-pass filter. The second magnetic inductor 1032 and a second silicon capacitor 1042 can form a second low-pass filter. The first and second magnetic inductors 1031, 1032 can be inversely magnetically coupled. The first and second half-bridge circuits 1011, 1012 can be located on opposite edges of the CMOS integrated circuit 800 to provide space to allow the first and second half-bridge circuits 1011, 1012 to be inversely magnetically coupled. By appropriately terminating the connections of the first and second magnetic inductors 1031, 1032 to the first and second CMOS power switches, respectively, the current through the first and second magnetic inductors 1031, 1032 can create DC flux that cancels, so that inverse magnetic coupling of the first and second magnetic inductors 1031, 1032 is achieved, which can reduce magnetic core saturation issues. For example, the output terminal of each magnetic inductor 1031, 1032 can be placed (e.g., laid out) alternatingly at opposite sides of the CMOS integrated circuit 800, so that the direction of the current flows through the magnetic inductor 1031, 1032 in opposite directions, thus causing inverse magnetic coupling to reduce the net magnetic flux.

The silicon capacitors 810 including the first and second silicon capacitors 1041, 1042 are physically attached and electrically coupled to the CMOS integrated circuit 800.

The input terminals 1033, 1034 of the first and second magnetic inductors 1031, 1032 are electrically coupled to the first and second half-bridge node 1013, 1014, respectively. The input terminal 1033 of the first magnetic inductor 1031 is electrically coupled to the input power supply and associated electrical network on the first silicon capacitor 1041 through the first half-bridge circuit 1011 (e.g., first CMOS power switch) that is formed on the CMOS integrated circuit 800. The input terminal 1034 of the second magnetic inductor 1032 is electrically coupled to the input power supply and associated electrical network on the second silicon capacitor 1042 through the second half-bridge circuit 1012 (e.g., second CMOS power switch) that is formed on the CMOS integrated circuit 800. Thus, the capacitors 1041, 1042 have independent electrical networks for each input and output power supply associated with the power converter 1000.

The output terminals 1035, 1036 of the first and second magnetic inductors 1031, 1032 are electrically coupled to the silicon capacitor(s) 810 through electrical interconnect(s) on the CMOS integrated circuit 800.

More than three terminations (e.g., 10s of terminations such as 10-50 terminations)) are used for each independent electrical network (Output Power 1, Output Power 2, Ground, Input Power) between each capacitor 1041, 1042 and the CMOS integrated circuit 800. The complementary terminations (e.g., Input Power and Ground, Output Power 1 and Ground, Output Power 2 and Ground, Output Power 1 and Output Power 2) can be spaced less than about 200 microns apart to limit parasitic inductance that develops between the respective capacitors 1041, 1042 and the CMOS integrated circuit 800 and to limit inductance in the connection to the capacitors 1041-1043. Both independent electrical networks are capacitively coupled (e.g., via capacitor 1043) to the same ground electrical network which can allow a return path to form through the capacitor 1043, reducing the resistance along this path and associated power loss.

Figure 11:
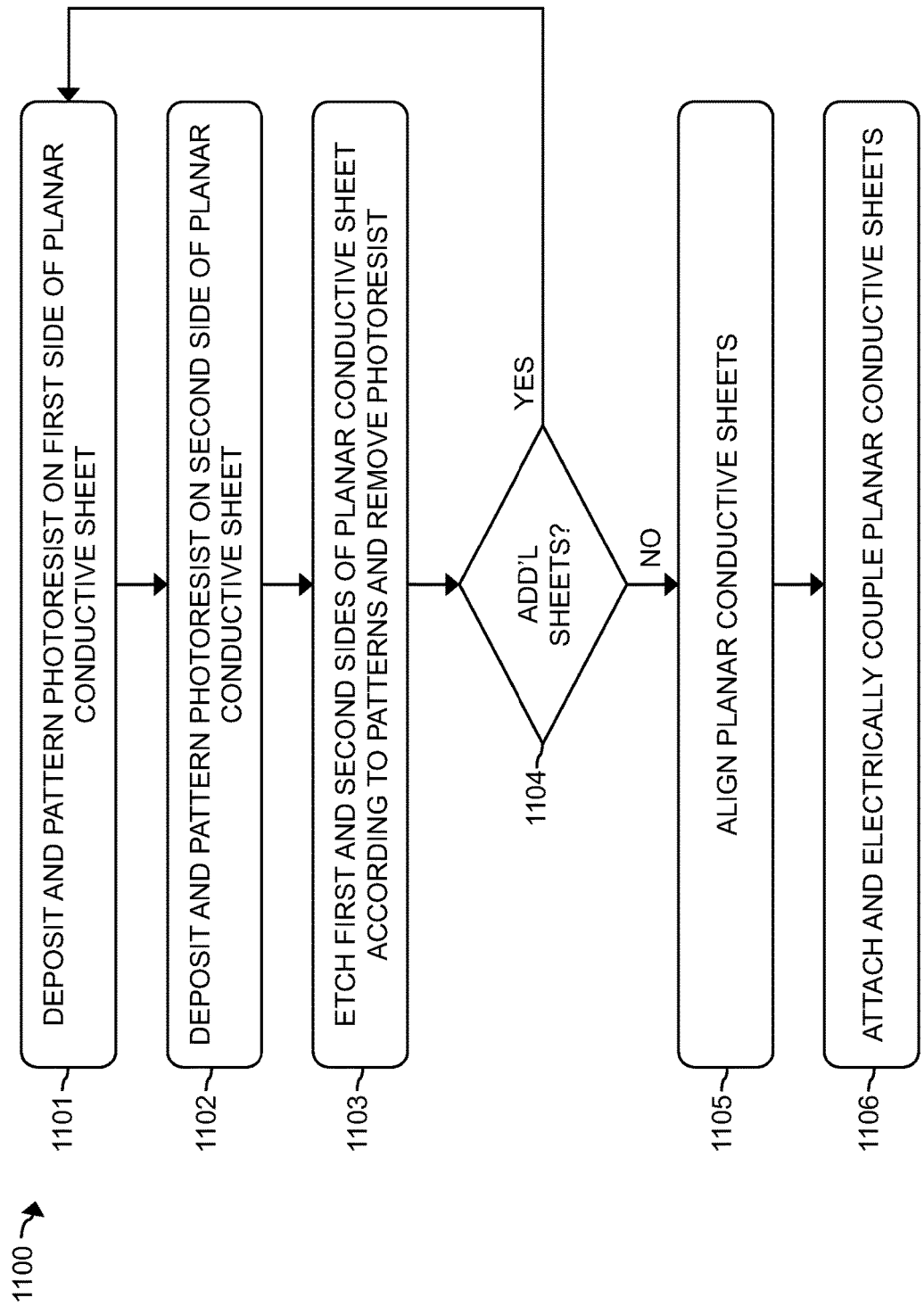
FIG. 11 is a flow chart of a method for manufacturing an electronics assembly according to an embodiment.

FIG. 11 is a flow chart of a method 1100 for manufacturing an electronics assembly according to an embodiment. Method 1100 can be used to form any of the electronics assemblies described herein.

In step 1101, photoresist is deposited and patterned on a first side of a planar conductive sheet.

In step 1102, photoresist is deposited and patterned on a second side of a planar conductive sheet. The first and second sides are on opposite sides of the planar conductive sheet. In addition, the first and second sides represent the major planar surfaces of the planar conductive sheet. The photoresist can be patterned in steps 1101 and 1102 using photolithography. The pattern on the first side of the planar conductive sheet can be the same as or different than the pattern on the second side of the planar conductive sheet.

Figure 12:
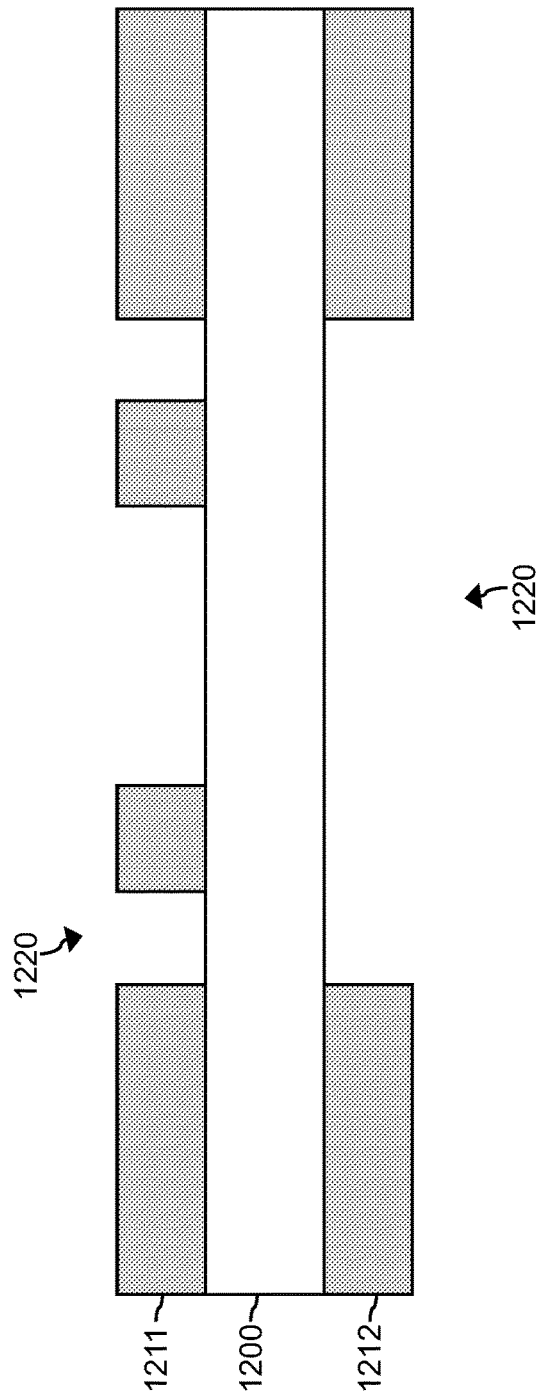
FIG. 12 is an example cross-sectional illustration of steps 1101 and 1102 of the method illustrated in FIG. 11.

An example of steps 1101-1102 is illustrated in FIG. 12 in which first and second photoresist layers 1211, 1212 are deposited and patterned on opposing first and second sides, respectively, of a planar conductive sheet 1200. Voids 1220 are formed in portions of the photoresist layers 1211, 1212 according to the respective patterns to expose the planar conductive sheet 1200.

In step 1103, the planar conductive sheet is etched (e.g., wet etched) according to the patterns formed in steps 1101 and 1102 and then the photoresist layers are removed. The planar conductive sheet can be etched by placing the planar conductive sheet in physical contact with a chemical etchant, such as an acid (e.g., ferric chloride, sulfuric acid) for a predetermined time period. For example, the planar conductive sheet can be placed in a container or bath with the chemical etchant. Alternatively, the chemical etchant can be sprayed on each side of the planar conductive sheet.

In the locations where the patterned photoresist layers include voids on both sides of the planar conductive sheet, the corresponding portion of the planar conductive sheet is fully etched and removed. In the locations where the patterned photoresist layers include voids on only side of the planar conductive sheet, the corresponding portion of the planar conductive sheet is partially etched and removed to form partial-height segments (e.g., partial-height segments 190).

Figure 13:
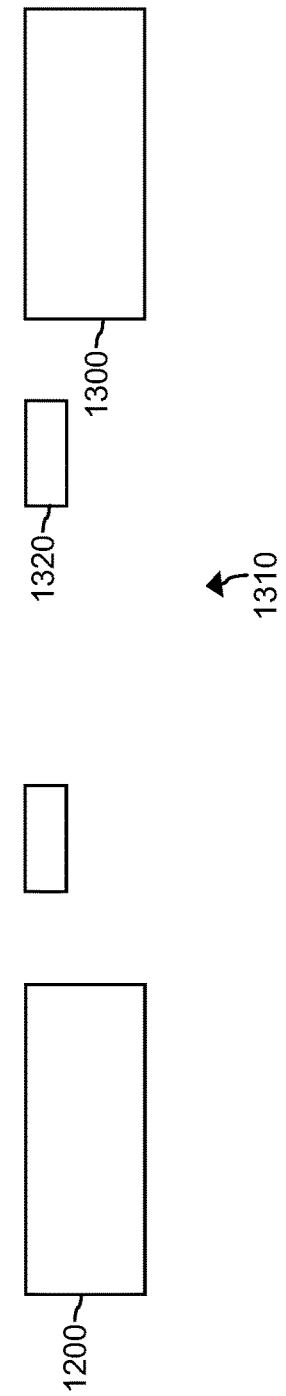
FIG. 13 is an example cross-sectional illustration of step 1103 of the method illustrated in FIG. 11.

An example of step 1103 is illustrated in FIG. 13 in which the planar conductive sheet 1200 is etched according to the patterned photoresist layers. Conductive metal traces 1300 are formed where one or both of the patterned photoresist layers 1211, 1212 (FIG. 12) remained on the planar conductive sheet 1200 to prevent the chemical etchant from physically contacting the planar conductive sheet 1200 during step 1103. Air gaps 1310 are formed where the voids 1220 (FIG. 12) in the patterned photoresist layers 1211, 1212 (FIG. 12) allowed the chemical etchant to physically contact the planar conductive sheet 1200 during step 1103. Partial-height segments 1320 are formed where the patterned photoresist layer (e.g., patterned photoresist layer 1212) remained on one side of the planar conductive sheet 1200 and voids 1220 are located on the other side of the planar conductive sheet 1200 such that the chemical etchant physically contact only one side of the planar conductive sheet 1200 at the location of the voids 1220.

The air gaps 1310 electrically isolate the conductive metal traces 1300. In some embodiments, the air gaps 1310 can form a cavity in a planar conductive sheet 1200 or in neighboring planar conductive sheet when the assembly is formed.

Returning to method 1100, in step 1104 it is determined whether there are any additional planar conductive sheets to pattern and/or etch for the electronics assembly. If so (i.e., step 1104=yes), steps 1101-1103 are repeated for each additional planar conductive sheet. When all planar conductive sheets to patterned and/or etched (i.e., step 1104=no), the method 1100 proceeds to step 1105 to align the planar conductive sheets. The planar conductive sheets can be aligned optically using alignment marks which can be created during patterning and etching in steps 1101-1103 for each planar conductive sheet.

After the planar conductive sheets are aligned, the neighboring planar conductive metal sheets are attached and electrically coupled in step 1106. The neighboring conductive metal sheets can be attached and electrically coupled through a conductive adhesive or a bonding process, such as diffusion soldering (e.g., transient liquid phase bonding) or diffusion bonding. In diffusion soldering, a tin solder can be applied through an electroless or an electrolytic plating process and then exposed to a temperature of about 300 C or higher for a predetermined time duration, such as about 1 hour to about 3 hours, to form a high strength and high melting temperature intermetallic compound such as $Cu_3Sn$ (e.g., when the conductive metal sheets include copper). In diffusion bonding, the neighboring conductive metal sheets are aligned, compressed, and heated to 800° C. or higher to bond the conductive metal sheets without the use of another material.

When the conductive metal sheets are attached and electrically coupled, a multilevel wiring structure is formed that includes one or more independent and electrically-isolated conductive paths that can carry current between the outermost conductive metal sheets (e.g., from the bottom surface of the bottom conductive metal to the top surface of the top conductive metal sheet and/or from a bottom level of the multilevel wiring structure to a top level of the multilevel wiring structure).

In some embodiments, the method 1100 further includes attaching and electrically coupling a microchip to the multilevel wiring structure. Additionally or alternatively, the method 1100 can further include attaching and electrically coupling one or more capacitors to the multilevel wiring structure and optionally to the microchip. The capacitor(s) can be attached in a cavity defined in the multilevel wiring structure. Additionally or alternatively, the method 1100 can include attaching and magnetically coupling one or more magnetic slabs to a high-inductance conductive path formed in the multilevel wiring structure. The magnetic slab(s) can be attached in a cavity defined in the multilevel wiring structure.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:

1. An electronics assembly comprising:
    a plurality of planar conductive metal sheets comprising:
        a first conductive metal sheet;
        a second conductive metal sheet attached and electrically coupled to the first metal sheet; and
        a third conductive metal sheet attached and electrically coupled to the second metal sheet, the second metal sheet located between the first and third conductive metal sheets,
    wherein metal traces are defined in the plurality of planar conductive metal sheets to form electrically isolated conductive paths between an outer surface of the first conductive metal sheet and an outer surface of the third conductive metal sheet in a multilevel conductive wiring network.

2. The assembly of claim 1, wherein:
    each conductive path has a respective aspect ratio in a range of about 2 to about 10, the respective aspect ratio calculated as a ratio of a height of each conductive path to a width of each conductive path, the height measured in a direction orthogonal to a major plane of a respective planar conductive metal sheet, the width measured in a direction orthogonal to a current flow direction and parallel to the major plane, and each conductive path has a length measured in a direction parallel to the current flow and to the major plane, the length larger than the width.

3. The assembly of claim 1, wherein a cavity is defined through at least the first conductive metal sheet, the cavity configured to receive a first magnetic slab, a first capacitor, and/or a first integrated circuit.

4. The assembly of claim 3, wherein:
the cavity is a first cavity, and
a second cavity is defined through at least the third conductive metal sheet, the second cavity configured to receive a second magnetic slab, a second capacitor, and/or a second integrated circuit.

5. The assembly of claim 4, wherein the conductive paths includes a high-inductance conductive path that has an inductance of at least about 500 pH, the high-inductance conductive path configured to conduct a current laterally on one or more of the planar conductive metal sheets located between the first and second cavities.

6. The assembly of claim 5, wherein:
a first magnetic slab is located in the first cavity,
a second magnetic slab is located in the second cavity, and
the first and second magnetic slabs are configured and arranged to increase the inductance of the high-inductance path compared to when the first and second magnetic slabs are not located in the first and second cavities, respectively.

7. The assembly of claim 6, wherein each magnetic slab has a magnetic permeability that is higher than about 10 and a loss tangent less than about 1 at a current frequency of 100 MHz.

8. The assembly of claim 7, wherein each magnetic slab includes a plurality of electrically-insulated laminations of a ferromagnetic material.

9. The assembly of claim 5, wherein:
the high-inductance path is a first high-inductance path,
the conductive paths include a second high-inductance path that has an inductance of at least about 500 pH, and
the first and second high-inductance paths are inversely coupled such that the current flowing through the first and second high-inductance paths produces first and second magnetic flux, respectively, the first and second magnetic flux at least partially canceling each other.

10. The assembly of claim 9, wherein a space between the first and second high-inductance paths is filled with a ferromagnetic-polymer composite material.

11. The assembly of claim 9, wherein the first and second high-inductance paths each conduct the current over more than about 50% of a length of the multilevel conductive wiring network.

12. The assembly of claim 11, wherein the first and second high-inductance paths terminate on a respective capacitor.

13. The assembly of claim 1, wherein a width of each metal trace is less than about 140 microns, the width orthogonal to a direction of current flow within a major plane of a respective planar conductive metal sheet.

14. The assembly of claim 1, wherein a cross-sectional area of the multilevel conductive wiring network in each planar conductive metal sheet is within a range of about 30% to about 100% of the cross-sectional area of a respective planar conductive metal sheet.

15. The assembly of claim 1, wherein at least one of the planar conductive metal sheets includes a partial-height metal segment in which a partial-height gap is defined between the partial-height metal segment and a neighboring planar conductive metal sheet, the partial-height gap electrically isolating the partial-height metal segment.

16. The assembly of claim 1, wherein the first conductive metal sheet has a different material composition than the second conductive metal sheet.

17. The assembly of claim 16, wherein:
the first metal comprises copper,
the second metal comprises tin, and
a solder bond comprising an intermetallic compound of the first and second metals is formed between neighboring planar conductive metal sheets.

18. The assembly of claim 1, wherein each of the planar conductive metal sheets comprises a first metal and the planar conductive metal sheets are bonded with a second metal that is different than the first metal.

19. The assembly of claim 1, wherein a composition of bonds between neighboring planar conductive metal sheets is the same as a composition of the neighboring planar conductive metal sheets.

20. The assembly of claim 1, wherein the conductive paths include a high-inductance conductive path that has an inductance of at least 500 pH.

21. The assembly of claim 20, wherein the high-inductance conductive path extends parallel to a major plane of one of the conductive metal sheets.

22. The assembly of claim 1, wherein the metal traces are defined, at least in part, by gaps defined in the plurality of planar conductive metal sheets.

23. The assembly of claim 22, wherein the gaps comprise air gaps.

24. An electronics assembly comprising:
a plurality of metal traces that define electrically isolated conductive paths between a top level and a bottom level of a multilevel conductive wiring network; and
a microchip attached and electrically coupled to the top level of the multilevel conductive wiring network,
wherein:
a first cavity is defined through the top level of the multilevel conductive wiring network, and
a second cavity is defined through the bottom level of the multilevel conductive wiring network.

25. The assembly of claim 24, wherein the microchip is located over the first cavity.

26. The assembly of claim 25, wherein the conductive paths include a high-inductance conductive path that has an inductance of at least 500 pH, the high-inductive conductive path located, at least in part, in the second cavity.

27. The assembly of claim 26, wherein a terminal of the high-inductance conductive path is electrically coupled to a first capacitor through the microchip.

28. The assembly of claim 26, wherein first and second magnetic slabs are located in the first and second cavities, respectively, the high-inductive conductive path located between the first and second magnetic slabs, the high-inductive conductive path magnetically coupled to the first and second magnetic slabs to form a magnetic inductor.

29. The assembly of claim 26, wherein one or more capacitors is/are located in the first cavity, the capacitor(s) attached and electrically coupled to the microchip.

30. The assembly of claim 29, wherein the microchip and the high-inductance path form a power converter.

31. The assembly of claim 30, wherein the capacitor(s) have independent electrical networks for an input power supply and an output power supply associated with the power converter.

32. The assembly of claim 30, wherein:
a first terminal of the high-inductance path is electrically coupled to a first capacitor and to an input power supply terminal through a half-bridge circuit formed in the microchip, and
a second terminal of the high-inductance path is electrically coupled to an output power supply terminal.

33. The assembly of claim 32, wherein the half-bridge circuit includes CMOS switches that alternate an electrical coupling of the first terminal of the high-inductance path to the input power supply terminal and to a ground terminal at a frequency of at least about 10 MHz to produce an output voltage at the second terminal of the high-conductance path, the output voltage between an input voltage of the input power supply terminal and a ground voltage at the ground terminal.

34. The assembly of claim 33, wherein the first and second high-inductance paths are inversely magnetically coupled.

35. The assembly of claim 32, wherein:
the half-bridge circuit is a first half-bridge circuit,
the high-inductance conductive path is a first high-inductance conductive path,
the conductive paths include a second high-inductance conductive path that has an inductance of at least about 500 pH, the second high-inductive conductive path located, at least in part, in the second cavity, and
a first terminal of the second high-inductance path is electrically coupled to a second capacitor and to the input power supply through a second half-bridge circuit formed in the microchip.

36. The assembly of claim 35, wherein:
the second terminal of the first high-inductance path is electrically coupled to a first output power supply terminal, and
the second terminal of the second high-inductance path is electrically coupled to a second output power supply terminal.

37. The assembly of claim 36, wherein:
the conductive paths through the first high-inductance path, the first capacitor, and the first half-bridge circuit comprise a first independent electrical network, and
the conductive paths through the second high-inductance path, the second capacitor, and the second half-bridge circuit comprise a second independent electrical network.

38. The assembly of claim 35, wherein the first and second capacitors have a capacitance of at least about 200 nF to provide an impedance of less than about 100 mOhms when the first and second bridge circuits operate at a frequency of less than or equal to about 200 MHz.

39. The assembly of claim 37, wherein:
the first and second capacitors are electrically coupled to a set of ground terminals, and
the space between each ground terminal and a respective nearest input power supply terminal is less than about 200 microns.

40. The assembly of claim 24, wherein gaps are defined between the metal traces, the gaps defining, at least in part, the electrically isolated conductive paths.

41. The assembly of claim 40, wherein the gaps comprise air gaps.

42. A method for manufacturing an electronics assembly, comprising:
(a) depositing and patterning a first photoresist layer on a first side of a first planar conductive sheet in a plurality of planar conductive sheets;
(b) depositing and patterning a second photoresist layer on a second side of the first planar conductive sheet;
(c) etching the first and second sides of the first planar conductive sheet according to patterns in the first and second photoresist layers to form electrically isolated conductive traces;
(d) repeating steps (a)-(c) for each additional planar conductive sheet in the planar conductive sheets;
(e) aligning the planar conductive sheets using alignment marks in the planar conductive sheets; and
(f) attaching and electrically coupling neighboring planar conductive sheets to form a multilevel wiring structure that includes electrically isolated conductive paths between a bottom level and a top level of the multilevel wiring structure.

43. The method of claim 42, wherein etching the first and second sides of the first planar conductive sheet includes forming gaps in the first planar conductive sheet, the gaps defining, at least in part, the electrically isolated conductive traces.

44. The method of claim 43, wherein the gaps comprise air gaps.

45. An electronics assembly comprising:
a plurality of planar conductive metal sheets comprising:
a first conductive metal sheet;
a second conductive metal sheet attached and electrically coupled to the first metal sheet; and
a third conductive metal sheet attached and electrically coupled to the second metal sheet, the second metal sheet located between the first and third conductive metal sheets,
wherein:
at least first and second electrically isolated conductive paths are defined through the planar conductive metal sheets in a multilevel conductive wiring network, and
one or more spaces between the first and second electrically isolated conductive paths is/are filled with a ferromagnetic-polymer composite material.

46. The assembly of claim 45, wherein the first electrically isolated conductive path and/or the second electrically isolated conductive path conductive path includes a respective high-inductance conductive path that has an inductance of at least about 500 pH.

47. The assembly of claim 46, wherein the one or more spaces includes one or more cavities defined in one or more of the planar conductive metal sheets.

48. The assembly of claim 47, wherein:
the one or more cavities includes a first cavity, and
the assembly further comprises a ferromagnetic slab disposed, at least in part, in the first cavity, the ferromagnetic slab comprising electrically-insulated laminations of a ferromagnetic material.

49. The assembly of claim 47, wherein:
the one or more cavities includes first and second cavities, and
the electronics assembly further comprises:
a first magnetic slab disposed, at least in part, in the first cavity,
a second magnetic slab disposed, at least in part, in in the second cavity,
wherein:
the first and second magnetic slabs are configured and arranged to increase an inductance of the high-inductance path compared to when the first and second magnetic slabs are not located in the first and second cavities, respectively, and each of the first and second magnetic slabs comprises respective electrically-insulated laminations of a ferromagnetic material.

50. The assembly of claim 49, wherein:

the first and second electrically isolated conductive paths comprise first and second high-inductance conductive paths, respectively, that have a respective inductance of at least about 500 pH, and the first and second high-inductance paths are configured to inversely coupled such that when a current flows through the first and second high-inductance paths, first and second magnetic flux, respectively, are produced, the first and second magnetic flux at least partially canceling each other.

51. An electronics assembly comprising:

a plurality of planar conductive metal sheets, each planar conductive metal sheet attached and electrically coupled to at least one neighboring planar conductive metal sheet;

a multilevel conductive wiring network defined in the planar conductive metal sheets, the planar conductive metal sheets including one or more spaces that define, at least in part, one or more electrically isolated conductive paths through each planar conductive metal sheet; and a ferromagnetic-polymer composite material disposed in at least each space.

52. The assembly of claim 51, wherein the one or more spaces includes one or more cavities defined in one or more of the planar conductive metal sheets.

53. The assembly of claim 52, wherein:

the one or more cavities includes a first cavity, and the assembly further comprises a ferromagnetic slab disposed, at least in part, in the first cavity, the ferromagnetic slab comprising electrically-insulated laminations of a ferromagnetic material.

54. The assembly of claim 53, wherein the ferromagnetic slab is embedded in the first cavity.

55. The assembly of claim 53, wherein:

the one or more electrically isolated conductive paths includes a first electrically isolated conductive path, and the ferromagnetic slab is magnetically coupled to the first electrically isolated conductive path.

56. The assembly of claim 55, wherein:

an inductor is formed in the multilevel conductive wiring network, and the first electrically isolated conductive path passes through the inductor.

57. The assembly of claim 56, wherein the first electrically isolated conductive path comprises a high-inductance conductive path that has an inductance of at least about 500 pH.

58. The assembly of claim 51, wherein:

the ferromagnetic-polymer composite material comprises a polymer and a plurality of ferromagnetic film platelets disposed in the polymer, each ferromagnetic platelet including at least a ferromagnetic layer disposed between first and second insulator layers, each ferromagnetic layer in each ferromagnetic film platelet has a respective hard axis of magnetization, and the respective hard axes of magnetization are aligned with one another.

* * * * *